US012593689B2

(12) United States Patent

He et al.

(10) Patent No.: US 12,593,689 B2

(45) Date of Patent: Mar. 31, 2026

(54) SEMICONDUCTOR STRUCTURE WITH DIAMOND HEAT DISSIPATION AND MANUFACTURING METHOD THEREOF

(71) Applicant: HUAWEI TECHNOLOGIES CO., LTD., Shenzhen (CN)

(72) Inventors: Ran He, Yokohama (JP); Huifang Jiao, Shenzhen (CN)

(73) Assignee: Huawei Technologies Co., LTD., Shenzhen (CN)

( * ) Notice: Subject to any disclaimer, the term of this patent is extended or adjusted under 35 U.S.C. 154(b) by 542 days.

(21) Appl. No.: 18/158,305

(22) Filed: Jan. 23, 2023

(65) Prior Publication Data

US 2023/0163043 A1 May 25, 2023

Related U.S. Application Data

(63) Continuation of application No. PCT/CN2020/105638, filed on Jul. 29, 2020.

(51) Int. Cl.
*H01L 23/373* (2006.01)
*H01L 21/02* (2006.01)
(Continued)

(52) U.S. Cl.
CPC .... *H01L 23/3732* (2013.01); *H01L 21/02376* (2013.01); *H01L 21/02527* (2013.01);
(Continued)

(58) Field of Classification Search
CPC ........... H01L 23/3732; H01L 21/02376; H01L 21/02527; H01L 21/042; H01L 21/4803;
(Continued)

(56) References Cited

U.S. PATENT DOCUMENTS

2009/0051039 A1* 2/2009 Kuo ...................... H01L 23/481
257/E23.145
2014/0264868 A1* 9/2014 Radulescu .............. H01L 24/29
438/622
(Continued)

FOREIGN PATENT DOCUMENTS

| CN | 110739226 A | 1/2020 | |
| KR | 20190032161 A | * 3/2019 | ....... H01L 21/76805 |
| WO | 2020050929 A1 | 3/2020 | |

OTHER PUBLICATIONS

Spiteri, David, Julian Anaya, and Martin Kuball. "The effects of grain size and grain boundary characteristics on the thermal conductivity of nanocrystalline diamond." Journal of Applied Physics 119.8 (2016). (Year: 2016).*

(Continued)

*Primary Examiner* — Norman D Richards
*Assistant Examiner* — Ethan Edward Cutler
(74) *Attorney, Agent, or Firm* — Fish & Richardson P.C.

(57) ABSTRACT

Embodiments of this application provide a semiconductor structure, an electronic device, and a manufacture method for a semiconductor structure, and relate to the field of heat dissipation technologies for electronic products. An example semiconductor structure includes a semiconductor device, a bonding layer, a substrate, a conducting via, and a metal layer. The semiconductor device is disposed on an upper surface of the substrate by using the bonding layer. The metal layer is disposed on a lower surface of the substrate. The substrate includes a base plate, a groove formed on the base plate, and a diamond accommodated in the groove. The conducting via penetrates the substrate, the bonding layer, and at least a part of the semiconductor device, and is electrically connected to the metal layer. The groove bypasses the conducting via.

16 Claims, 16 Drawing Sheets

(51) Int. Cl.

| | |
|---|---|
| *H01L 21/04* | (2006.01) |
| *H01L 21/48* | (2006.01) |
| *H01L 21/768* | (2006.01) |
| *H01L 23/00* | (2006.01) |
| *H01L 23/522* | (2006.01) |

(52) U.S. Cl.

CPC ........ *H01L 21/042* (2013.01); *H01L 21/4803* (2013.01); *H01L 21/76877* (2013.01); *H01L 23/5226* (2013.01); *H01L 24/32* (2013.01); *H01L 2224/32113* (2013.01); *H01L 2224/32225* (2013.01); *H01L 2224/32501* (2013.01); *H01L 2924/10157* (2013.01); *H01L 2924/13064* (2013.01)

(58) Field of Classification Search

CPC ........... H01L 21/76877; H01L 23/5226; H01L 24/32; H01L 2224/32113; H01L 2224/32225; H01L 2224/32501; H01L 2924/10157; H01L 2924/13064; H01L 21/6835; H01L 23/3677; H01L 2221/68345; H01L 2221/68377; H01L 21/76898; H01L 23/481; H10D 30/475; H10D 62/8503

See application file for complete search history.

(56) References Cited

U.S. PATENT DOCUMENTS

| | | | |
|---|---|---|---|
| 2015/0108500 A1* | 4/2015 | Irsigler | H10D 30/015 257/77 |
| 2019/0296112 A1 | 9/2019 | Yoshimochi | |
| 2020/0083167 A1* | 3/2020 | LaRoche | H10D 64/254 |
| 2020/0235030 A1* | 7/2020 | Kim | H01L 23/40 |

OTHER PUBLICATIONS

International Search Report and Written Opinion in International Appln. No. PCT/CN2020/105638, mailed on Apr. 1, 2021, 15 pages (with English translation).

* cited by examiner

SEMICONDUCTOR STRUCTURE WITH DIAMOND HEAT DISSIPATION AND MANUFACTURING METHOD THEREOF

CROSS-REFERENCE TO RELATED APPLICATIONS

This application is a continuation of International Application No. PCT/CN2020/105638, filed on Jul. 29, 2020, the disclosure of which is hereby incorporated by reference in its entirety.

TECHNICAL FIELD

This application relates to the field of heat dissipation technologies for electronic products, and in particular, to a semiconductor structure, an electronic device, and a manufacture method for a semiconductor structure.

BACKGROUND

With rapid development of semiconductor technologies, a quantity of transistors on a chip continuously increases. High-density transistor integration and an increase of a circuit speed indicate a continuous increase of a unit power of a chip. However, the chip inevitably generates more heat due to the increase of the unit power. This is likely to cause an excessively high temperature of an electronic device. When a temperature of the electronic device is excessively high, performance and a service life of the electronic device are rapidly degraded.

In a conventional technology, a heat dissipation manner is to dissipate heat by using a diamond material. For example, in a high electron mobility transistor (HEMT) semiconductor structure, a diamond usually needs to be used to dissipate heat.

FIG. 1 is a schematic diagram of an HEMT semiconductor structure in a conventional technology. The HEMT semiconductor structure includes an HEMT 1, a diamond substrate 2, a metal grounding layer 3, and a heat sink 4. The HEMT 1 is placed on the diamond substrate 2, and heat generated by the HEMT 1 is transferred to the metal grounding layer 3 through the diamond substrate 2, and is then dissipated through the heat sink 4.

The HEMT 1 includes three layers: an aluminum gallium nitride (AlGaN) layer 101, a gallium nitride (GaN) layer 102, and a base plate layer 103. A source T1, a gate T2, and a drain T3 are formed at the AlGaN layer 101. The base plate layer 103 may be a Si base plate, a SiC base plate, or the like. The source of the HEMT 1 needs to be grounded. Therefore, a via that starts from an upper surface (also referred to as an active surface) of the HEMT 1, penetrates the diamond substrate 2, and reaches the metal grounding layer 3 needs to be provided in the entire semiconductor structure.

When the semiconductor structure shown in FIG. 1 is prepared, as shown in 2a of FIG. 2, the HEMT 1 is connected to the diamond substrate 2 by using a bonding layer 5; as shown in 2b of FIG. 2, processing is then performed on the HEMT 1, the bonding layer 5, and the diamond substrate 2 to generate a via 6 that reaches the source of the HEMT 1; and as shown in 2c of FIG. 2, a conducting material is deposited in the via 6 to form a conducting path.

That is, in a preparation process of the semiconductor structure, a hole needs to be provided on the diamond substrate 02. However, efficiency of providing a hole on the diamond substrate is quite low. This does not meet a requirement of large-scale mass production.

SUMMARY

Embodiments of this application provide a semiconductor structure, an electronic device, and a manufacture method for a semiconductor structure, mainly to provide a semiconductor structure capable of improving efficiency of providing a hole.

To achieve the foregoing objectives, the following technical solutions are used in embodiments of this application.

According to a first aspect, this application provides a semiconductor structure, including a semiconductor device, a bonding layer, a substrate, a conducting via, and a metal layer. The semiconductor device is disposed on an upper surface of the substrate by using the bonding layer. The metal layer is disposed on a lower surface of the substrate. The substrate includes a base plate, a groove formed on the base plate, and a diamond accommodated in the groove. The conducting via penetrates the substrate, the bonding layer, and at least a part of the semiconductor device, and is electrically connected to the metal layer. The groove bypasses the conducting via.

In the semiconductor structure provided in this embodiment of this application, because the substrate includes the base plate provided with the groove, the diamond is accommodated in the groove, and the groove bypasses the conducting via. This can be understood as follows: When the groove is provided on the base plate, a boss is reserved for the conducting via, and then a hole is provided on the reserved boss. Compared with providing a hole on the diamond, this significantly reduces difficulty in providing a hole, and improves efficiency of providing a hole, so that large-scale mass production can be implemented.

In a possible implementation of the first aspect, the base plate is a Si base plate or a SiC base plate. A first reason is that difficulty of a process of providing a hole on the Si base plate or the SiC base plate is low. A second reason is that the Si base plate or the SiC base plate also has a high heat conductivity and a good heat dissipation effect.

In a possible implementation of the first aspect, the diamond on a bottom surface of the groove is exposed outside the base plate. A heat conductivity of the diamond can reach 2000 W/mK at a room temperature, and a heat conductivity of Si or SiC is approximately 150 W/mK. Obviously, the heat conductivity of the diamond is much higher than the heat conductivity of the Si or the SiC. Therefore, a thickness of the base plate is reduced to expose the diamond, so that heat dissipation efficiency is significantly improved.

In a possible implementation of the first aspect, the diamond includes a first diamond layer and a second diamond layer. The first diamond layer is formed on the bottom surface and a side wall surface of the groove, and the second diamond layer is formed on the first diamond layer. An average volume of grains of the first diamond layer is smaller than an average volume of grains of the second diamond layer.

In a possible implementation of the first aspect, the first diamond layer on the bottom surface of the groove is exposed outside the base plate. Compared with hiding the first diamond layer in the base plate, exposing the first diamond layer reduces thermal resistance and improves heat dissipation efficiency.

In a possible implementation of the first aspect, the second diamond layer on the bottom surface of the groove is exposed outside the base plate. Because the average volume of diamond grains of the second diamond layer is larger than the average volume of diamond grains of the first diamond layer, a heat conductivity of the second diamond layer is higher than a heat conductivity of the first diamond layer. Compared with hiding the second diamond layer in the first diamond layer, exposing the second diamond layer further reduces thermal resistance and further improves heat dissipation efficiency.

In a possible implementation of the first aspect, there are a plurality of conducting vias, the plurality of conducting vias are arranged at intervals, the base plate has a boss, and the plurality of conducting vias are all provided on the boss.

That is, when there are a plurality of conducting vias, the boss is formed on the base plate, so that the plurality of conducting vias are provided on the boss, that is, the base plate is on a periphery of the conducting vias. Compared with disposing the diamond (including the first diamond layer and the second diamond layer) on the periphery of the conducting vias, this effectively reduces difficulty of a process of preparing high-density conducting vias, and can improve strength of the entire semiconductor structure.

In a possible implementation of the first aspect, the semiconductor device is an active device including a grounding structure, the metal layer is a grounding layer, and the conducting via penetrates the semiconductor device and is electrically connected to the grounding structure.

In a possible implementation of the first aspect, the semiconductor device is an HEMT.

In a possible implementation of the first aspect, the semiconductor device is a chip, the metal layer is a second rewiring layer, the conducting via penetrates a passive layer of the chip and is electrically connected to a first rewiring layer on an active layer of the chip, there is an insulation layer between the second rewiring layer and the substrate, and there is an insulation layer between the conducting via and the chip, the bonding layer, and the substrate. The insulation layer is disposed to ensure stability of signal transmission of the first rewiring layer and the second rewiring layer.

In a possible implementation of the first aspect, there is an intermediate metal layer on a surface, of the semiconductor device, that is opposite to the bonding layer, and the conducting via is electrically connected to the intermediate metal layer.

In a possible implementation of the first aspect, a part, of the conducting via, that is located on the semiconductor device is a first section of conducting via; a part, of the conducting via, that is located on the substrate and the bonding layer is a second section of conducting via; and both an area of a cross section of the first section of conducting via and an area of a cross section of the second section of conducting via are smaller than a surface area of the intermediate metal layer; and/or an axial direction of the first section of conducting via and an axial direction of the second section of conducting via are not on one straight line.

In a possible implementation of the first aspect, a via is provided on the substrate, the bonding layer, and the semiconductor device, a conducting layer is formed on an inner wall surface of the via, and the via that is in a hollow structure and that has the conducting layer forms the conducting via.

That is, the conducting layer is formed on the inner wall surface of the via to implement the conducting via, that is, the conducting via is in a hollow structure. The semiconductor device generates a large amount of heat during operation. The heat is transferred to the conducting via, and the conducting via expands. The conducting via is designed to have a hollow structure, so that the expanded conducting via does not generate large thermal stress on the semiconductor device, thereby avoiding impact on performance of the semiconductor device.

In a possible implementation of the first aspect, a via is provided on the substrate, the bonding layer, and the semiconductor device, the via is filled with a conducting material, and the via that is in a solid structure and that is filled with the conducting material forms the conducting via.

In a possible implementation of the first aspect, the bonding layer includes a polycrystalline silicon carbide layer, an amorphous silicon carbide layer, or a polycrystalline silicon carbide layer and an amorphous silicon carbide layer that are stacked. Polycrystalline silicon carbide and amorphous silicon carbide have a high heat conductivity, and are also convenient for processing and manufacturing.

According to a second aspect, an embodiment of this application further provides a manufacture method for a semiconductor structure. The manufacture method includes:

providing a groove on a surface of a base plate to form a boss;

disposing a diamond in the groove to obtain a substrate including the base plate and the diamond;

disposing a semiconductor device on an upper surface of the substrate by using a bonding layer;

providing a via on the boss, the bonding layer, and at least a part of the semiconductor device, and performing metallization processing on the via to form a conducting via; and disposing a metal layer on a lower surface of the substrate, so that the conducting via is electrically connected to the metal layer.

In the manufacture method for a semiconductor structure in this embodiment of this application, a hole is provided on the boss of the base plate. Compared with a manner of providing a hole on a diamond in a conventional technology, this reduces difficulty in providing a hole, and improves efficiency of providing a hole. In addition, when a semiconductor structure is cut, the base plate may be cut. Compared with cutting the diamond, this also improves cutting efficiency.

In a possible implementation of the second aspect, after the diamond is disposed in the groove, the method further includes: removing the base plate on a bottom surface of the groove, so that the diamond on the bottom surface of the groove is exposed outside the base plate. The base plate on the bottom surface of the groove is removed, so that heat dissipation efficiency is further improved.

In a possible implementation of the second aspect, the disposing a diamond in the groove includes:

preparing a nanocrystalline diamond seed layer on the bottom surface and a side wall surface of the groove; and preparing a nanocrystalline diamond nucleation layer on the nanocrystalline diamond seed layer, so that nanograins grow to form a microcrystalline diamond layer, where a diamond layer with a nanometer-level average volume of grains forms a first diamond layer, and a diamond layer with a micrometer-level average volume of grains forms a second diamond layer.

The nanocrystalline diamond seed layer is first prepared in the groove, so that the nanocrystalline diamond nucleation layer is uniformly deposited in the groove, thereby facilitating growth of diamond grains.

In a possible implementation of the second aspect, when the nanocrystalline diamond seed layer is prepared, colloidal diamond particles may be sprayed to prepare the nanocrystalline diamond seed layer, or ultrasonic processing may be performed in a nanocrystalline diamond particle solution to prepare the nanocrystalline diamond seed layer.

In a possible implementation of the second aspect, when the nanocrystalline diamond nucleation layer is prepared, a chemical vapor deposition method is used for preparation.

In a possible implementation of the second aspect, after the diamond is disposed in the groove, the method further includes: removing the base plate on the bottom surface of the groove, so that the first diamond layer on the bottom surface of the groove is exposed outside the base plate. In a semiconductor structure prepared in this manner, the first diamond layer is exposed. Compared with hiding the first diamond layer in the base plate, this further improves a heat dissipation effect of the semiconductor structure.

In a possible implementation of the second aspect, after the diamond is disposed in the groove, the method further includes: removing the base plate on the bottom surface of the groove, so that the second diamond layer on the bottom surface of the groove is exposed outside the base plate.

In a semiconductor structure prepared in this manner, the second diamond layer is exposed. Compared with hiding the second diamond layer in the first diamond layer, this further improves a heat dissipation effect.

In a possible implementation of the second aspect, after the providing a via, the method further includes: forming a conducting layer on an inner wall surface of the via, so that the via that is in a hollow structure and that has the conducting layer forms a conducting via; or filling the via with a conducting material, so that the via that is in a solid structure and that is filled with the conducting material forms a conducting via.

In a possible implementation of the second aspect, after the providing a via on the boss, the bonding layer, and at least a part of the semiconductor device, the method further includes: disposing an insulation layer on an inner wall surface of the via, disposing an insulation layer on the lower surface of the substrate, and then performing metallization processing on the via with the insulation layer.

According to a third aspect, this application further provides an electronic device, including a printed circuit board and the semiconductor structure in any implementation of the first aspect or the semiconductor structure prepared in any implementation of the second aspect, where the printed circuit board is electrically connected to the semiconductor structure.

The electronic device provided in this embodiment of this application includes the semiconductor structure provided in the embodiment of the first aspect or the semiconductor structure prepared in the second aspect. Therefore, the electronic device provided in this embodiment of this application and the semiconductor structure in the foregoing technical solutions can resolve a same technical problem and achieve a same expected effect.

REFERENCE NUMERALS

1: HEMT; 101: AlGaN layer; 102: GaN layer; 103: base plate layer; 2: diamond substrate; 3: metal grounding layer; 4: heat sink; 5: bonding layer; 6: via; 7: semiconductor device; 8: substrate; 81: base plate; 811:

groove; 812: boss; 82: diamond; 82A: first diamond layer; 82B: second diamond layer; 821: nanocrystalline diamond seed layer; 822: nanocrystalline diamond nucleation layer; 9: metal layer; 10: conducting via; 101: first section of conducting via; 102: second section of conducting via; 111: active layer; 112: passive layer; 113: first rewiring layer; 12: insulation layer; 13: intermediate metal layer; 14: mask layer, A1: bottom surface of the groove; and A2: side wall surface of the groove.

DESCRIPTION OF EMBODIMENTS

An electronic device includes a printed circuit board and a semiconductor structure electrically connected to the printed circuit board. High-density transistor integration and an increase of a circuit speed indicate a continuous increase of a unit power of a semiconductor structure and a continuous increase of generated heat.

In an optional implementation, the electronic device may be a mobile phone, a tablet computer, or the like.

Figure 3:
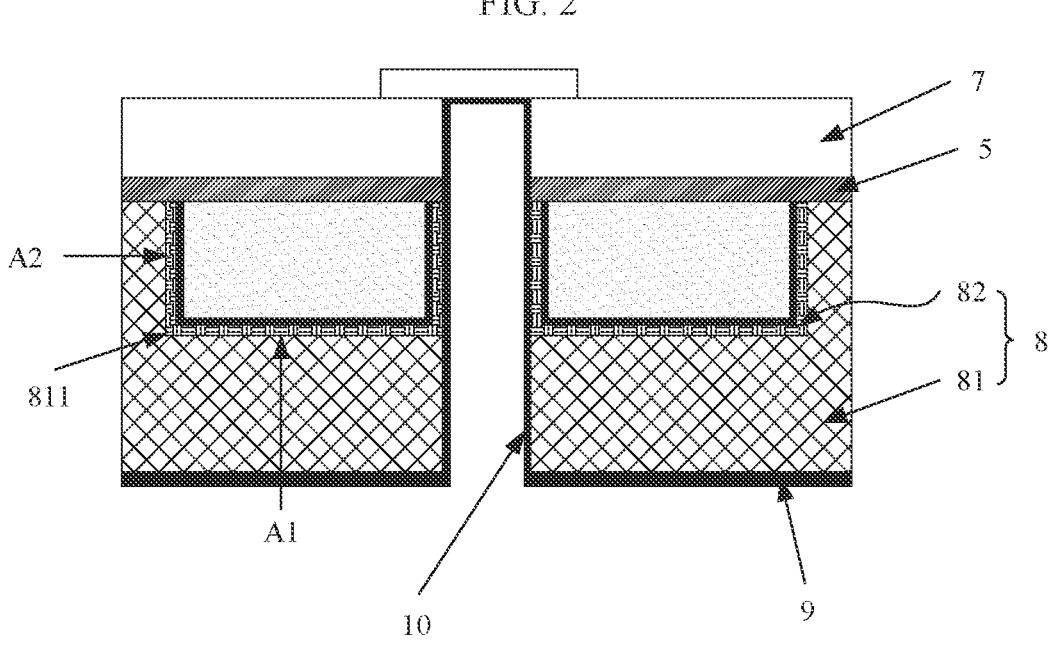
FIG. 3 is a schematic diagram of a structure of a semiconductor structure according to an embodiment of this application.

FIG. 3 is a schematic diagram of a semiconductor structure according to an embodiment of this application. The semiconductor structure includes a semiconductor device 7, a bonding layer 5, a substrate 8, and a metal layer 9.

The semiconductor device 7 is formed on an upper surface of the substrate 8 by using the bonding layer 5. The metal layer 9 is formed on a lower surface of the substrate 8.

Figure 1:
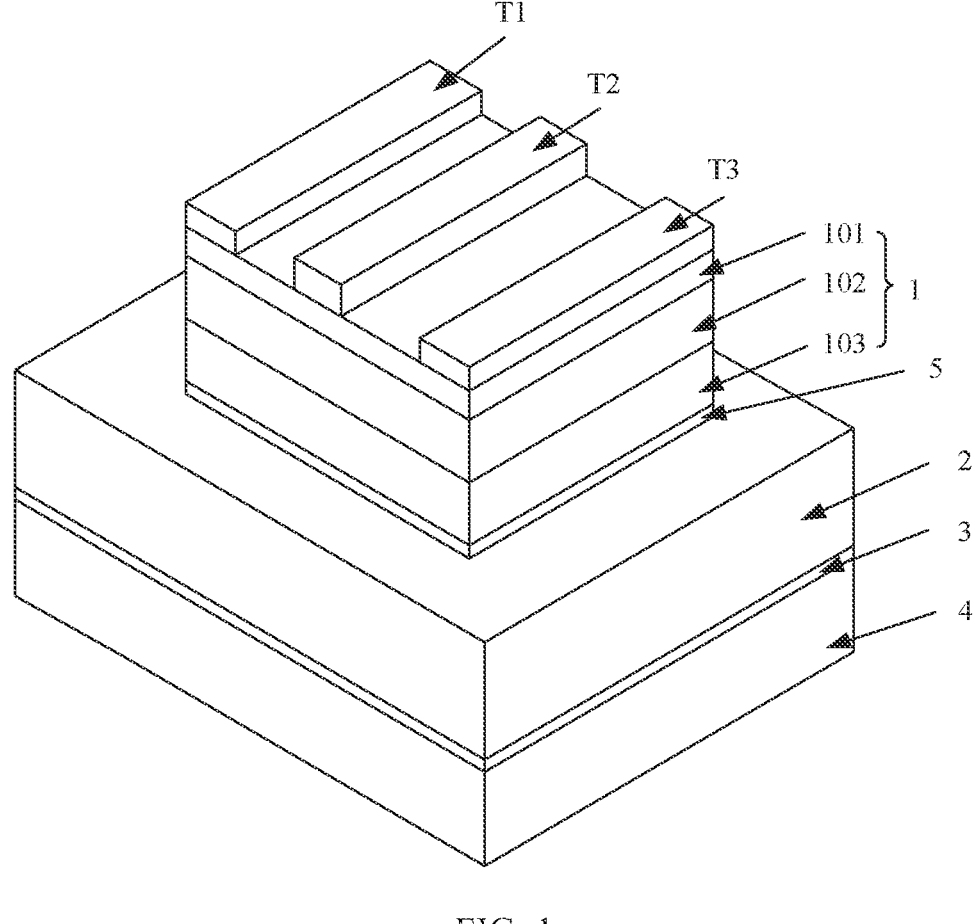
FIG. 1 is a schematic diagram of a structure of an HEMT in a conventional technology.
Figure 2:
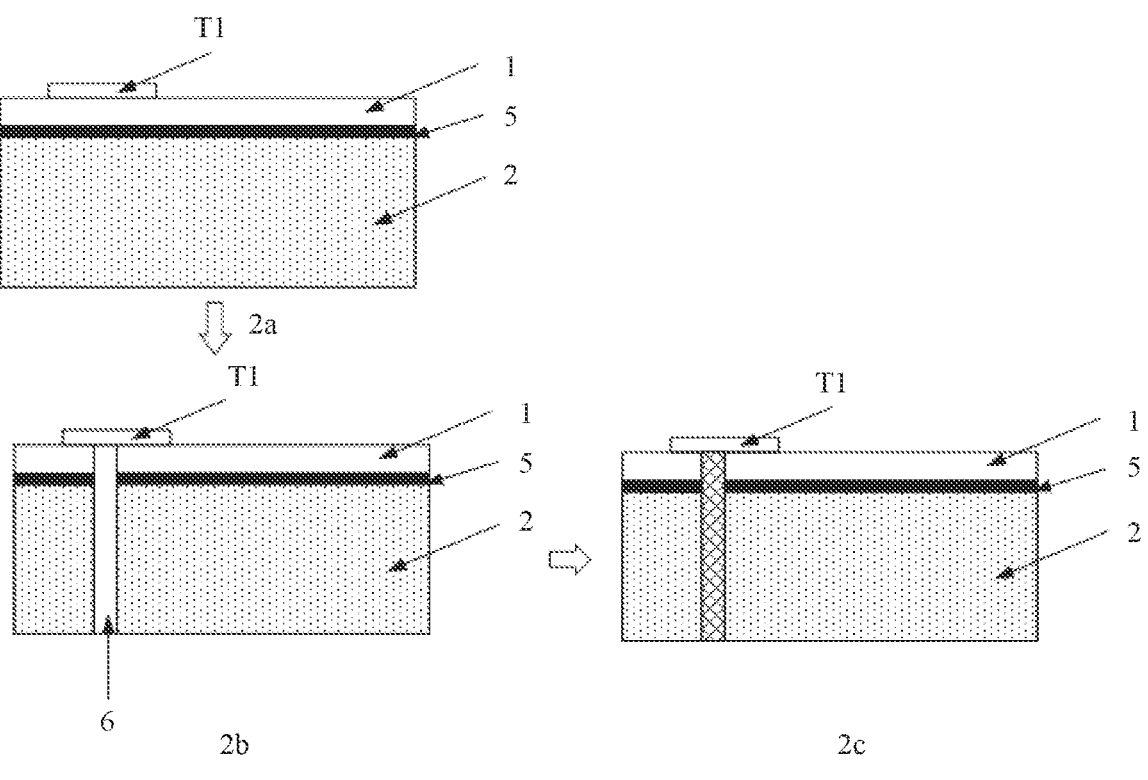
FIG. 2 is a schematic diagram of a corresponding structure obtained after steps of a manufacture method for an HEMT in a conventional technology are completed.

In this embodiment of this application, the semiconductor device 7 may be the HEMT 1 shown in FIG. 1, and includes three main parts: an AlGaN layer 101, a GaN layer 102, and a base plate layer 103. In an optional implementation, the semiconductor device 7 may alternatively be a semiconductor device of another type, or may be a chip equipped with an HEMT or a semiconductor device of another type.

The substrate 8 includes a base plate 81 and a diamond 82 embedded in the base plate 81. In an optional embodiment, a groove 811 whose opening faces the bonding layer 5 is formed on the base plate 81, the diamond 82 is disposed in the groove 811, and a surface of the diamond 82 is in contact with the bonding layer 5.

In this embodiment of this application, a structure that needs to be grounded may be disposed in the semiconductor device 7. For example, an HEMT is used as an example. A source of the HEMT needs to be grounded, and the metal layer 9 serves as a grounding layer, that is, the source of the HEMT needs to be connected to the metal layer 9. In an optional implementation, the semiconductor device is a chip, the chip needs to be stacked with and electrically connected to another chip, and the metal layer 9 serves as a rewiring layer, that is, the chip needs to be connected to the metal layer 9, and then the metal layer 9 is electrically connected to the another chip. Therefore, the semiconductor structure in this embodiment of this application further includes a conducting via 10 that penetrates the substrate 8, the bonding layer 5, and at least a part of the semiconductor device 7.

Figure 4A:
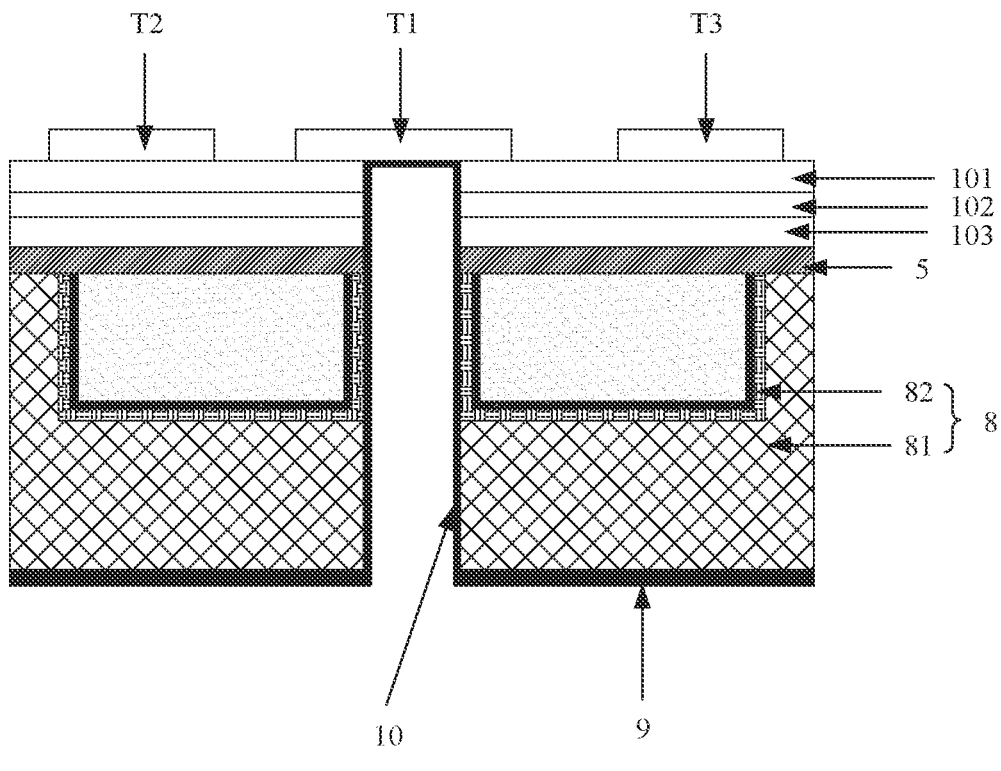
FIG. 4a is a schematic diagram of a semiconductor structure including an HEMT according to an embodiment of this application.

In an embodiment shown in FIG. 4a, a source T1 of an HEMT that needs to be grounded is formed on a surface of the semiconductor device. Therefore, the conducting via 10 penetrates the semiconductor device 7 and reaches the source T1 of the HEMT. In an embodiment shown in FIG. 4b, the semiconductor device is a chip and includes an active layer 111 and a passive layer 112, a semiconductor device is integrated at the active layer 111, and the conducting via 10 penetrates the passive layer 112 and is electrically connected to a semiconductor device at the active layer 111.

As shown in FIG. 3, the groove 811 on the substrate 8 bypasses the conducting via 10, in other words, a boss is reserved for the conducting via 10 when the groove 811 is formed. No groove or diamond is formed at a position that the conducting via 4 needs to penetrate, thereby avoiding a problem of providing a hole on a diamond, reducing difficulty in manufacturing the entire semiconductor structure, and improving efficiency of providing a hole.

There may be a plurality of cases for a material of the base plate 81. For example, a Si base plate may be selected. For another example, a SiC base plate may be selected.

When a Si base plate is selected, a heat conductivity of the Si base plate is high, and heat dissipation of the semiconductor device is not affected; and the Si base plate is cost-effective, and manufacturing costs of the entire semiconductor structure can be reduced. When a SiC base plate is selected, a heat conductivity of the SiC base plate is also high, and heat dissipation of the semiconductor device is not affected; and the SiC base plate is resistant to a high temperature, and a hole can be quite easily provided on the high-temperature-resistant SiC base plate.

FIG. 4a is a detailed schematic diagram of a semiconductor structure including an HEMT. The semiconductor structure includes an AlGaN layer 101, a GaN layer 102, and a base plate layer 103 that are stacked. A source T1, a gate T2, and a drain T3 are formed at the AlGaN layer 101. A substrate 8 including a base plate 81 and a diamond 82 is connected to the base plate layer 103 by using a bonding layer 5. The semiconductor structure includes two base plate structures, including the base plate layer 103 and the base plate 81. The GaN layer 102 and the AlGaN layer 101 are formed on the base plate layer 103, and the base plate 81 is configured to carry the diamond 82.

In the structure of FIG. 4a, the GaN layer 102 may be directly connected to the substrate 8 by using the bonding layer 5, without using the base plate layer 103.

Figure 4B:
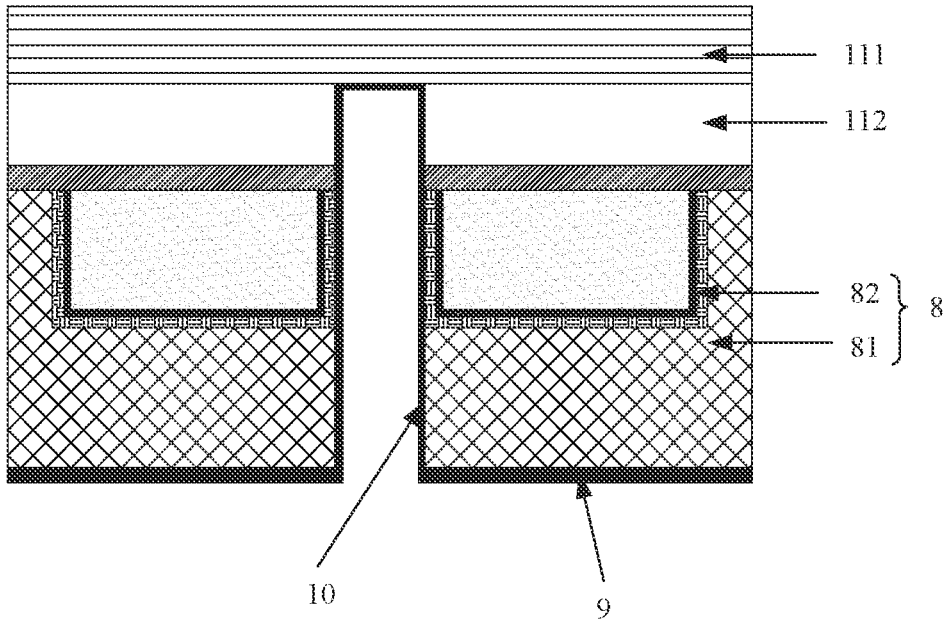
FIG. 4b is a schematic diagram of a semiconductor structure including a chip according to an embodiment of this application.

FIG. 4b is a detailed schematic diagram of a semiconductor structure including a chip. The semiconductor structure includes an active layer 111 and a passive layer 112 that are stacked. A substrate 8 including a base plate 81 and a diamond 82 is connected to the passive layer 112 by using a bonding layer 5. The semiconductor structure includes two base plates, including the passive layer 112 and the base plate 81. The active layer 111 is formed on the passive layer 112, and the base plate 81 is configured to carry the diamond 82.

In the structure shown in FIG. 4b, the passive layer 112 is bonded to the substrate by using the bonding layer 5. In an optional implementation, the passive layer 112 may be located above the active layer 111, and the active layer 111 is bonded to the substrate by using the bonding layer 5. In this case, the conducting via may directly reach the active layer.

In the structure shown in FIG. 4b, because the chip is made of a Si material or a SiC material, if the chip is directly in contact with the conducting via, a semiconductor device, in the chip, that does not need to be electrically connected to the conducting via is electrically connected to the conducting via. To avoid this phenomenon, as shown in FIG. 5, an insulation layer 12 is formed on a side wall surface on which the conducting via is in contact with the chip.

In this embodiment of this application, a material of the bonding layer is usually one of Si, SiC, $SiO_2$, and SiN, where the SiC may be polycrystalline silicon carbide or amorphous silicon carbide. A first reason is that the polycrystalline silicon carbide and the amorphous silicon carbide have a high heat conductivity. A second reason is that the polycrystalline silicon carbide and the amorphous silicon carbide are also convenient for processing and manufacturing. In an optional implementation, a polycrystalline silicon carbide layer forms the bonding layer, or an amorphous silicon carbide layer forms the bonding layer, or a polycrystalline silicon carbide layer and an amorphous silicon carbide layer that are stacked form the bonding layer.

Figure 5:
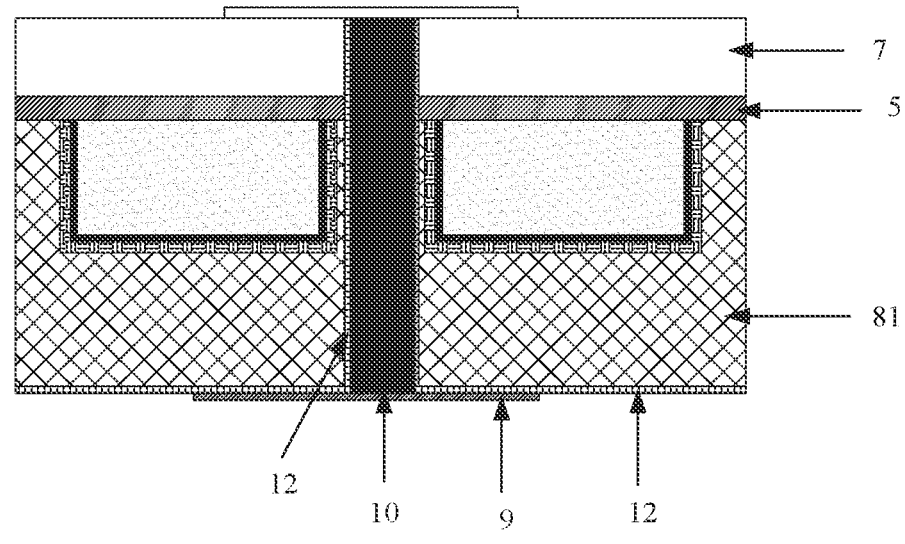
FIG. 5 is a schematic diagram of a semiconductor structure according to an embodiment of this application.

To prevent the bonding layer from being electrically connected to the conducting via, as shown in FIG. 5, an insulation layer 12 is also formed between the conducting via 10 and the bonding layer 5.

In the structure shown in FIG. 5, when the conducting via is in contact with the base plate 81, to prevent the Si base plate or the SiC base plate from being electrically connected to the conducting via, an insulation layer 12 is also formed between the conducting via 10 and the base plate 81.

In the structure shown in FIG. 5, when the metal layer on the lower surface of the substrate is in contact with the base plate, to prevent the Si base plate or the SiC base plate from being electrically connected to the metal layer, an insulation layer 12 is also formed between the metal layer 9 and the base plate 81.

Figure 6:
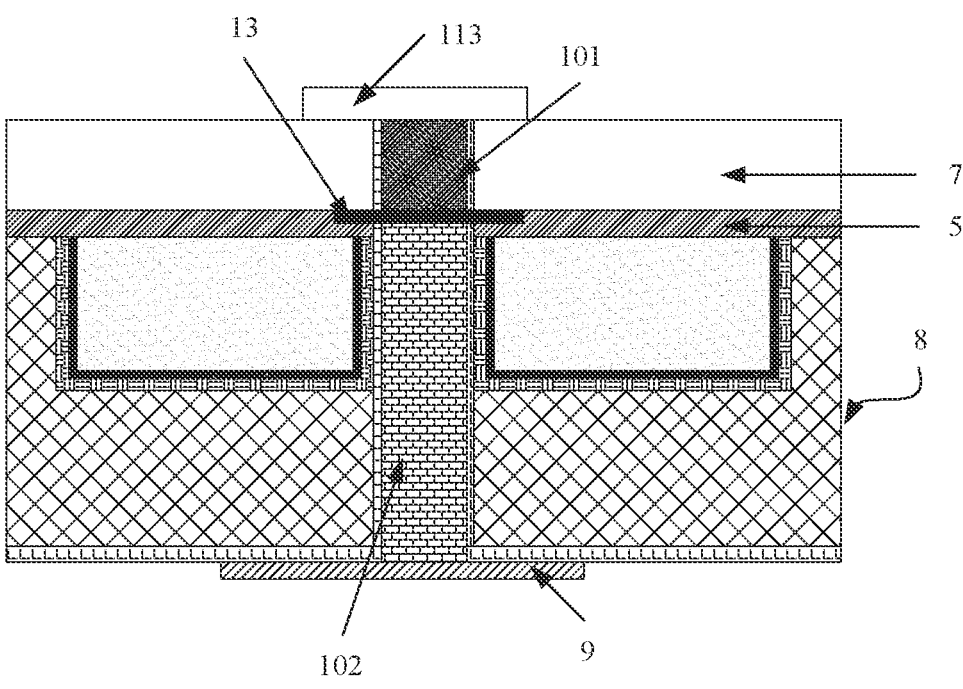
FIG. 6 is a schematic diagram of a semiconductor structure according to an embodiment of this application.

FIG. 6 is a schematic diagram of a semiconductor structure according to another embodiment. Before the semiconductor device 7 is bonded to the substrate 8, there is already a conducting via (for ease of description below, the conducting via is referred to as a first section of conducting via 101) on the semiconductor device 7, and there is an intermediate metal layer 13, on a lower surface of the semiconductor device 7, that is electrically connected to the first section of conducting via 101. In this case, a conducting via needs to be provided only on the substrate 8 and the bonding layer 5 (for ease of description below, the conducting via is referred to as a second section of conducting via 102), and is electrically connected to the intermediate metal layer 13. Usually, a surface area of a surface, of the intermediate metal layer 13, that is in contact with the semiconductor device 7 is much larger than an area of a cross section of the first section of conducting via. Therefore, when the second section of conducting via is formed, even if an axial direction of the second section of conducting via and an axial direction of the first section of conducting via are not on a straight line, or an area of a cross section of the second section of conducting via is different from the area of the cross section of the first section of conducting via, the first section of conducting via and the second section of conducting via can be electrically connected. Therefore, during processing of the second section of conducting via, processing difficulty is reduced.

Figure 7:
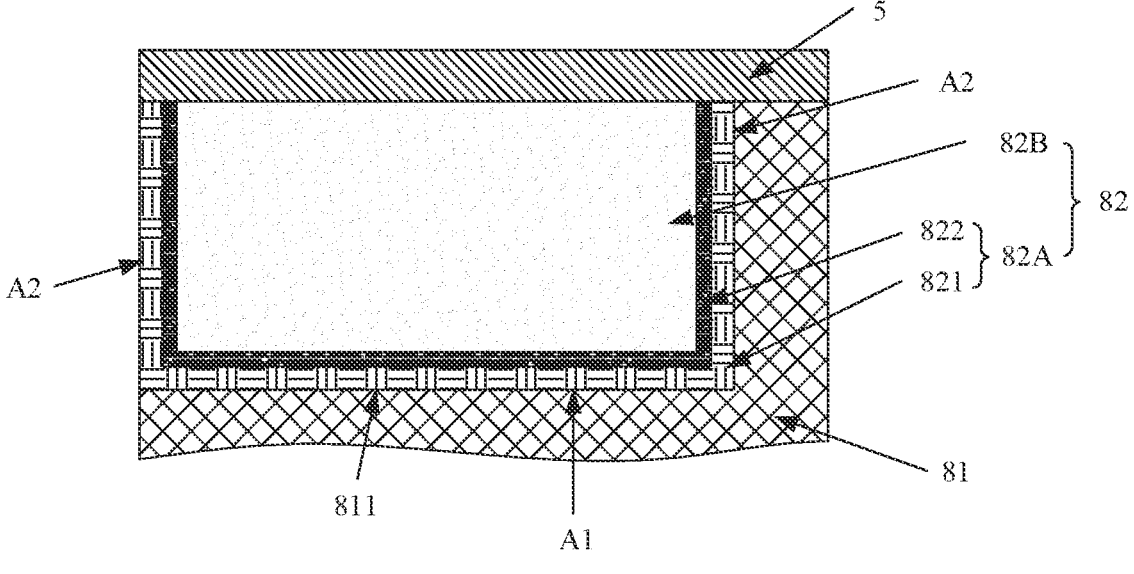
FIG. 7 is a schematic diagram of a structure of a substrate of a semiconductor structure according to an embodiment of this application.

FIG. 7 is a schematic diagram of a substrate in a semiconductor structure according to still another embodiment. In FIG. 7, the substrate includes a base plate 81, a groove 811 formed on the base plate 81, and a diamond 82 formed in the groove 811. The diamond 82 includes a first diamond layer 82A and a second diamond layer 82B. The first diamond layer 82A is formed on a bottom surface (a surface A1 in FIG. 7) and a side wall surface (a surface A2 in FIG. 7) of the groove 811. The second diamond layer 82B is formed on the first diamond layer 82A. In this embodiment of this application, an average volume of diamond grains of the first diamond layer 82A is smaller than an average volume of diamond grains of the second diamond layer 82B.

In a diamond preparation process, as shown in FIG. 7, a nanocrystalline diamond seed layer 821 is first prepared on the bottom surface A1 and the side wall surface A2 of the groove 811, and then a nanocrystalline diamond nucleation layer 822 is deposited on the nanocrystalline diamond seed layer 821. In a process of depositing the nanocrystalline diamond nucleation layer 822, diamond grains gradually grow to form a microcrystalline diamond layer. A diamond layer with a nanometer-level average volume of grains forms the first diamond layer 82A, and a diamond layer with a micrometer-level average volume of grains forms the second diamond layer 82B.

The nanocrystalline diamond seed layer 821 is first prepared on the bottom surface A1 and the side wall surface A2 of the groove 811, so that the nanocrystalline diamond nucleation layer 822 can be uniformly deposited in the groove 811, and a favorable condition is provided for subsequent growth of grains. Therefore, grains in a finally formed diamond are uniformly distributed, thereby improving heat dissipation efficiency of the diamond.

Figure 8:
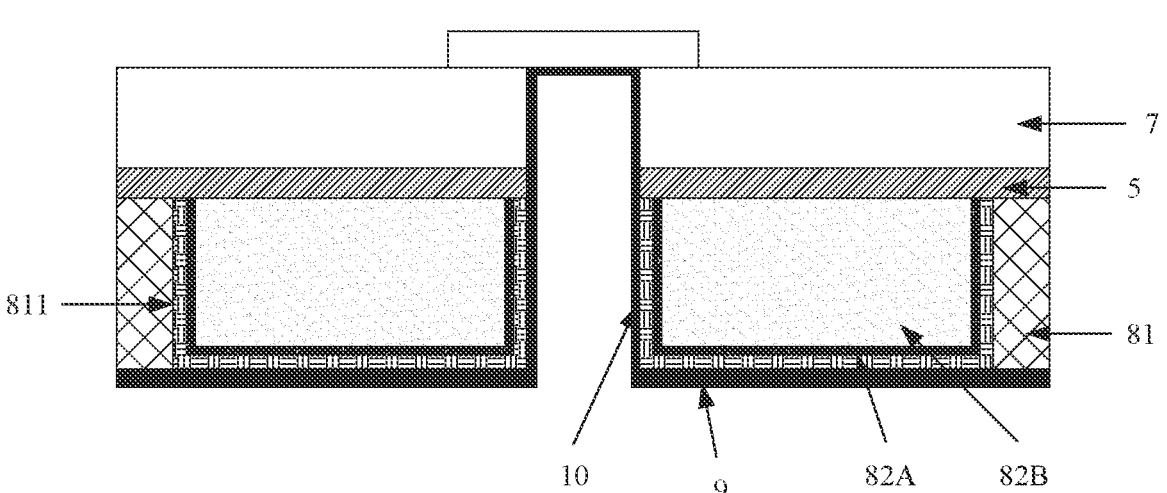
FIG. 8 is a schematic diagram of a semiconductor structure according to an embodiment of this application.

In this embodiment of this application, the diamond 82 is carried in the base plate 81. A specific carrying manner may be shown in FIG. 3. A groove 811 whose opening faces the bonding layer 5 is provided on the base plate 81, and the bonding layer 5 and the groove 811 enclose an accommodation space for carrying the diamond 82. Certainly, to ensure a heat dissipation effect, an upper surface of the diamond 82 is attached to a surface of the bonding layer 5 for absorbing heat from the bonding layer 5. Likewise, other surfaces of the diamond are attached to an inner wall of the groove 811 of the base plate 81 for absorbing heat from the base plate in a plurality of directions. In an optional embodiment, a thickness of a base plate under the groove may be reduced, to shorten a distance from the diamond to the metal layer. As shown in FIG. 8, the base plate under the groove 811 may be completely removed, that is, the diamond on the bottom surface of the groove 811 is exposed outside the base plate. Compared with hiding the diamond in the base plate, this greatly improves heat dissipation efficiency.

When the diamond includes a first diamond layer and a second diamond layer, in an optional implementation, as shown in FIG. 8, the first diamond layer 82A on the bottom surface of the groove 811 is exposed outside the base plate 81. In another optional implementation, as shown in FIG. 9, the second diamond layer 82B on the bottom surface of the groove 811 is exposed outside the base plate 81.

Compared with the embodiment of FIG. 9, a technical effect achieved in FIG. 8 is as follows: Because the average volume of grains of the second diamond layer 82B is larger than the average volume of grains of the first diamond layer 82A, a heat conductivity of the second diamond layer 82B is higher than a heat conductivity of the first diamond layer 82A. The first diamond layer 82A is removed, and the second diamond layer 82B is exposed, so that thermal resistance is further reduced, and heat dissipation efficiency is further improved.

Figure 9:
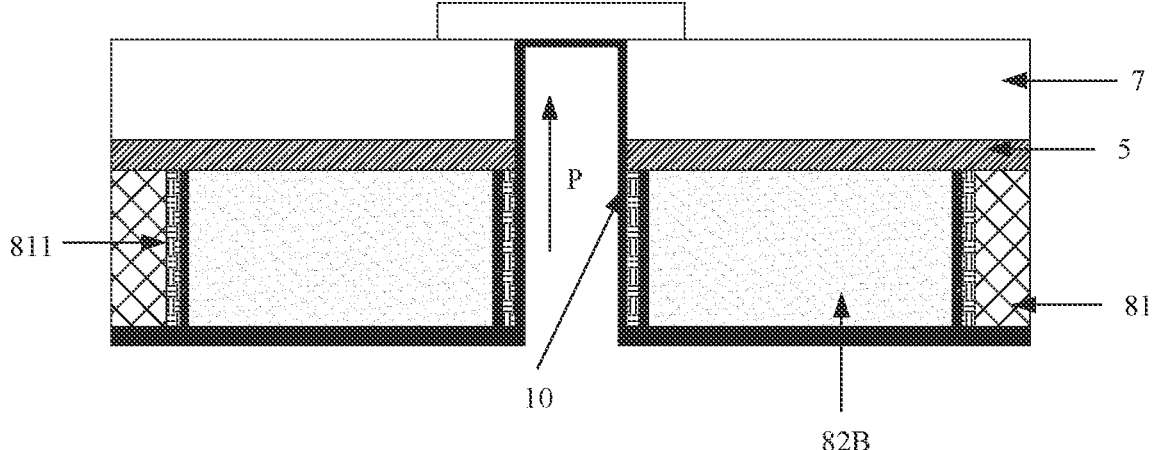
FIG. 9 is a schematic diagram of a semiconductor structure according to an embodiment of this application.
Figure 10:
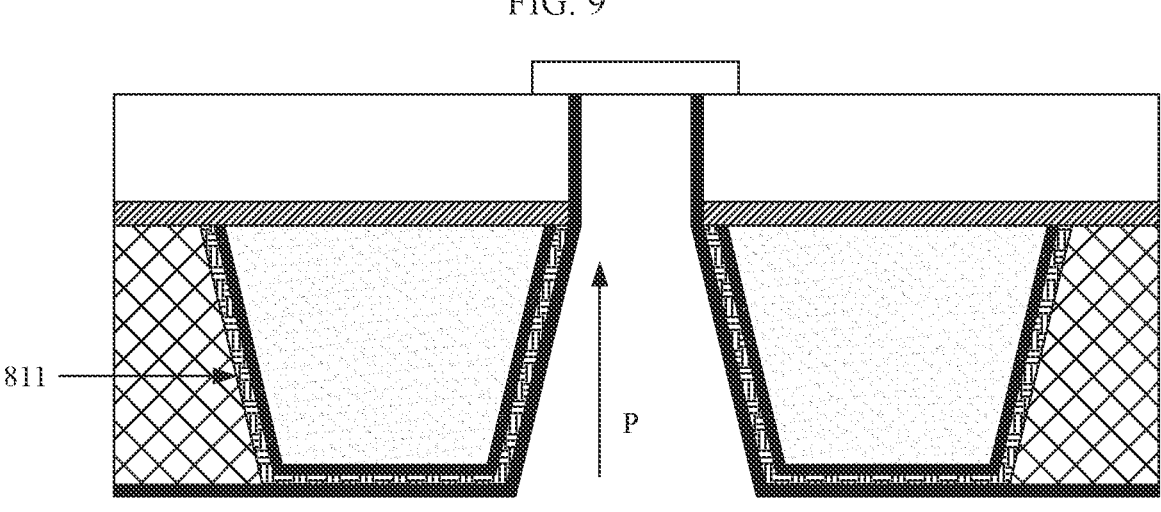
FIG. 10 is a schematic diagram of a semiconductor structure according to an embodiment of this application.

In this embodiment of this application, the diamond is formed in the groove, and a shape of the groove may be shown in FIG. 9 and FIG. 10. In FIG. 9, an area of a cross section of the groove 811 remains unchanged in a direction from the bottom to the top of the groove (a direction P in FIG. 9). In FIG. 10, an area of a cross section of the groove 811 gradually increases in a direction from the bottom to the top of the groove (a direction P in FIG. 10).

A preparation process of the first diamond layer and the second diamond layer includes a growth stage of diamond grains. With continuous growth of grains, a volume of grains gradually increases, and an increasingly large space is occupied. The groove is provided in the structure shown in FIG. 10, so that grains uniformly grow in the groove to ensure a heat dissipation effect of a final diamond. In addition, when the opening of the groove is large, there is a large contact area between the diamond and the bonding layer, and heat conduction efficiency is improved correspondingly.

In the semiconductor structure provided in this embodiment of this application, there may be only one conducting via, or there may be a plurality of conducting vias. For example, when the semiconductor device is an HEMT and a size of a source is large, a plurality of conducting vias need to be provided and electrically connected to the source. For another example, the semiconductor device is a chip, and a plurality of semiconductor devices with different functions are carried on the chip. In this case, a plurality of conducting vias need to be provided and correspondingly electrically connected to the plurality of semiconductor devices.

Figure 11:
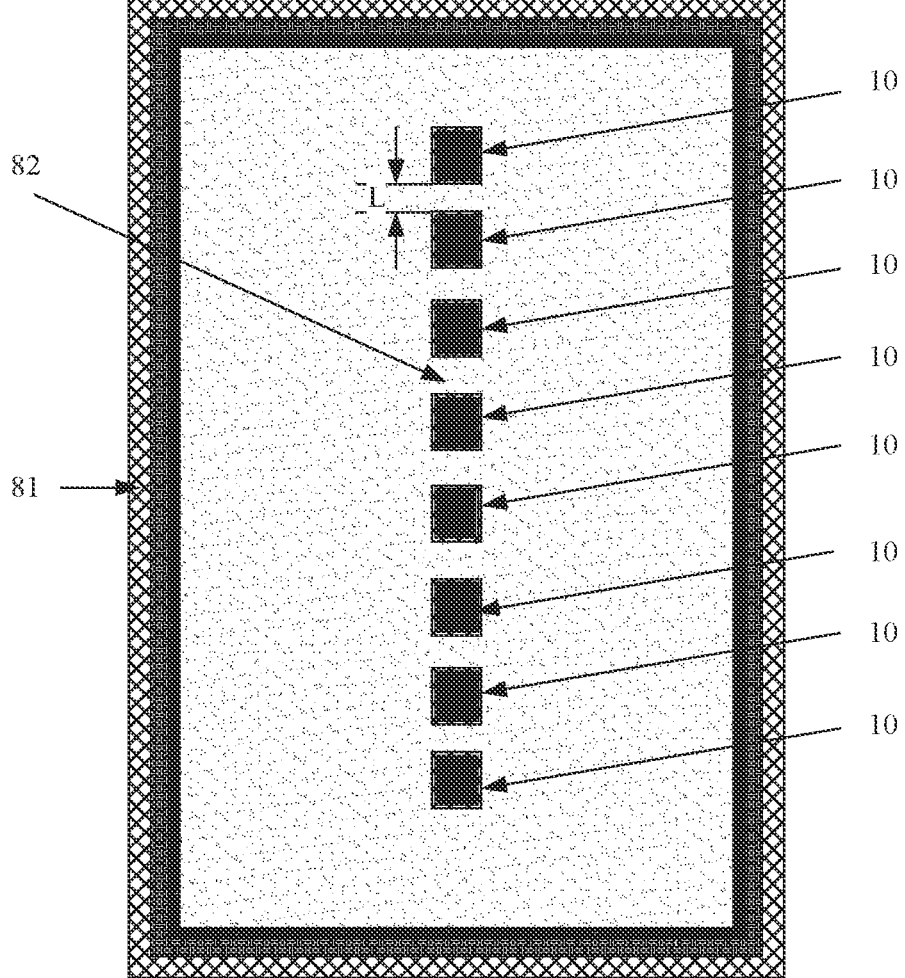
FIG. 11 is a schematic diagram of a semiconductor structure with a plurality of conducting vias according to an embodiment of this application.
Figure 12:
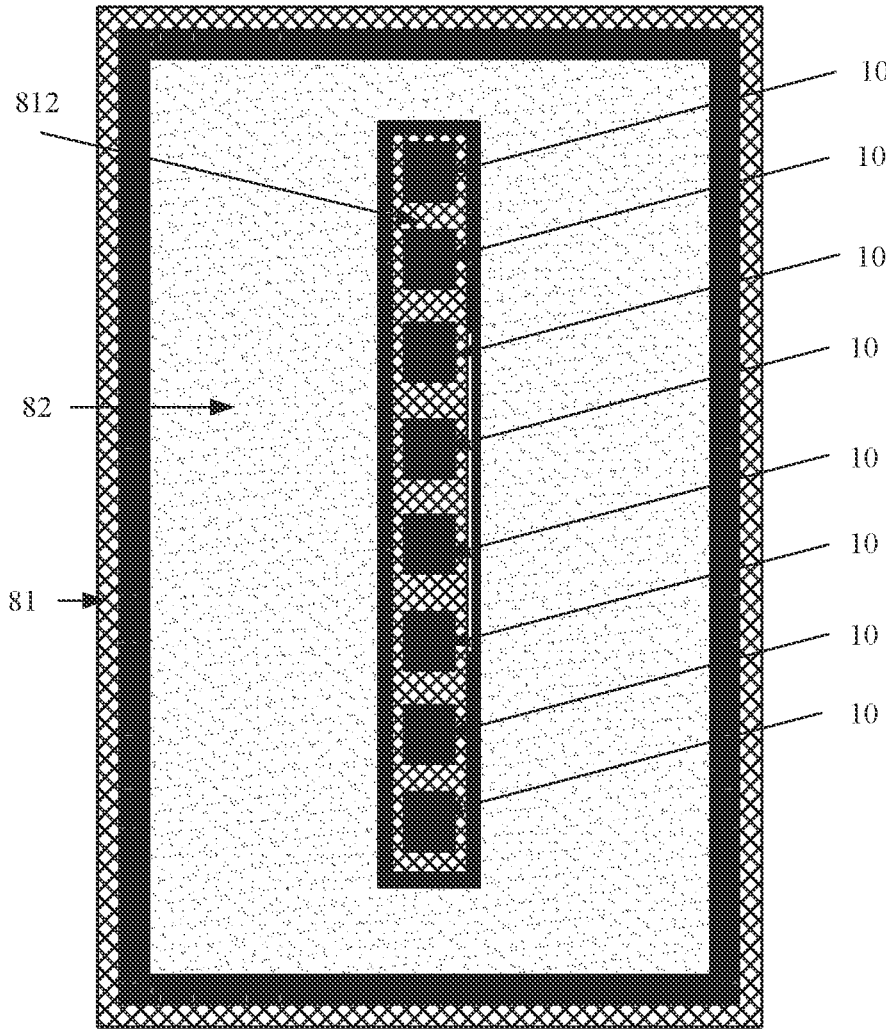
FIG. 12 is a schematic diagram of a semiconductor structure with a plurality of conducting vias according to an embodiment of this application.
Figure 13:
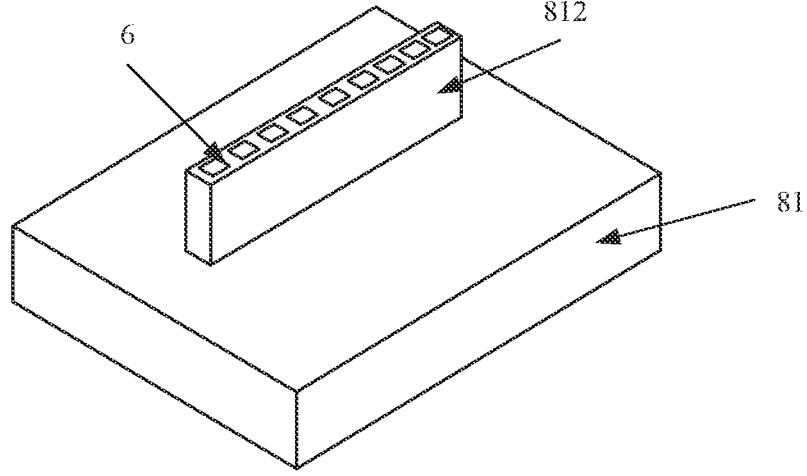
FIG. 13 is a schematic diagram of a structure of a base plate in FIG. 12.

FIG. 11 and FIG. 12 each are a schematic diagram of a semiconductor structure with a plurality of conducting vias. A semiconductor device of the semiconductor structure is an HEMT. Because the HEMT has a strip-shaped structure, the plurality of conducting vias are also arranged on one straight line. FIG. 13 is a schematic diagram of a structure of a base plate shown in FIG. 12.

In FIG. 11, there is a diamond 82 on a periphery of each conducting via 10. This can be understood as follows: When a groove is provided on a base plate 81, only one conducting via can be formed in a boss reserved for a conducting via. In FIG. 12, there is a base plate structure on a periphery of each conducting via 10. As shown in FIG. 13, when a groove is provided on a base plate 81, a boss 812 in a strip-shaped structure is formed based on an arrangement track of a plurality of conducting vias. In this way, the plurality of conducting vias are all provided in the boss 812. If the plurality of conducting vias are arranged based on another track, the formed boss may alternatively be in another shape, provided that the formed boss 812 can accommodate the plurality of conducting vias. However, a volume of the boss cannot be excessively large. If the volume of the boss is large, a volume occupied by the diamond is small. This also affects a heat dissipation effect of the semiconductor structure.

When there are a plurality of conducting vias, especially when a spacing between two adjacent conducting vias is small (L shown in FIG. 11 is a spacing between two adjacent conducting vias), the structure shown in FIG. 12 is preferentially used in this application. A reason is as follows: If a spacing between two adjacent conducting vias is small, and when the structure shown in FIG. 11 is used, a distance between two adjacent bosses reserved for conducting vias is small. In this case, a groove between the two adjacent bosses is quite small, and further, it is difficult to uniformly and sufficiently deposit a diamond in the quite small groove. As a result, strength and a heat dissipation effect of a finally formed diamond are reduced. However, if the structure shown in FIG. 12 and FIG. 13 is used, the foregoing phenomenon can be avoided, and a manufacturing process can also be simplified.

Figure 14:
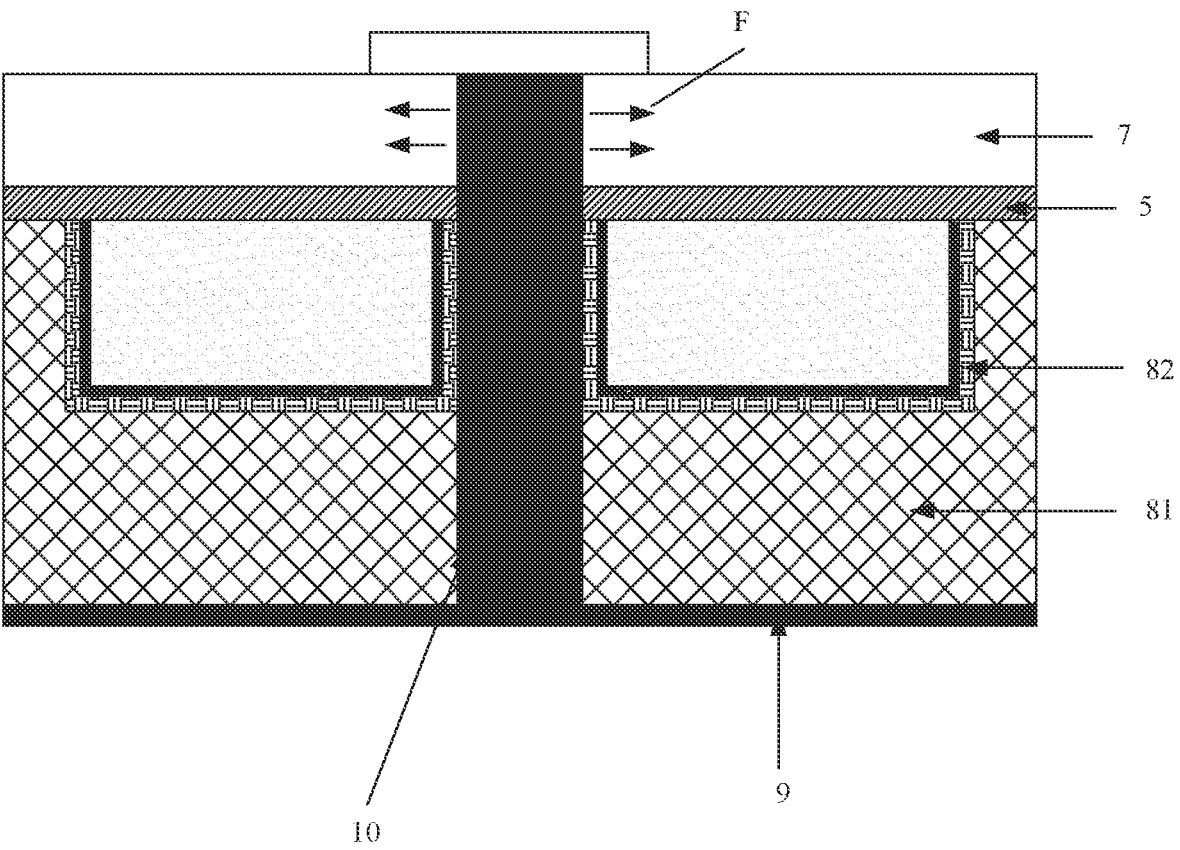
FIG. 14 is a schematic diagram of a semiconductor structure according to an embodiment of this application.

FIG. 9 and FIG. 14 show conducting vias in two different structures. In FIG. 9, a via is provided on the substrate, the bonding layer, and the semiconductor device, a conducting layer is formed on an inner wall surface of the via, and the via that is in a hollow structure and that has the conducting layer forms the conducting via 10. In FIG. 14, a via is provided on the substrate, the bonding layer, and the semiconductor device, the via is filled with a conducting material, and the via that is in a solid structure and that is filled with the conducting material forms the conducting via 10.

During operation of the semiconductor device, a part of generated heat is transferred to the conducting via. In FIG. 14, when the conducting via is in the solid structure, the conducting via absorbs heat and undergoes thermal expansion, and then generates thermal stress F on the semiconductor device. The thermal stress F may cause deformation to the semiconductor device, affecting performance of the semiconductor device. However, when the conducting via is in the structure shown in FIG. 9, even if heat of the semiconductor device is transferred to the conducting via, the conducting via has a specific thermal expansion space, and thermal stress F generated on the semiconductor device is greatly reduced.

Figure 15:
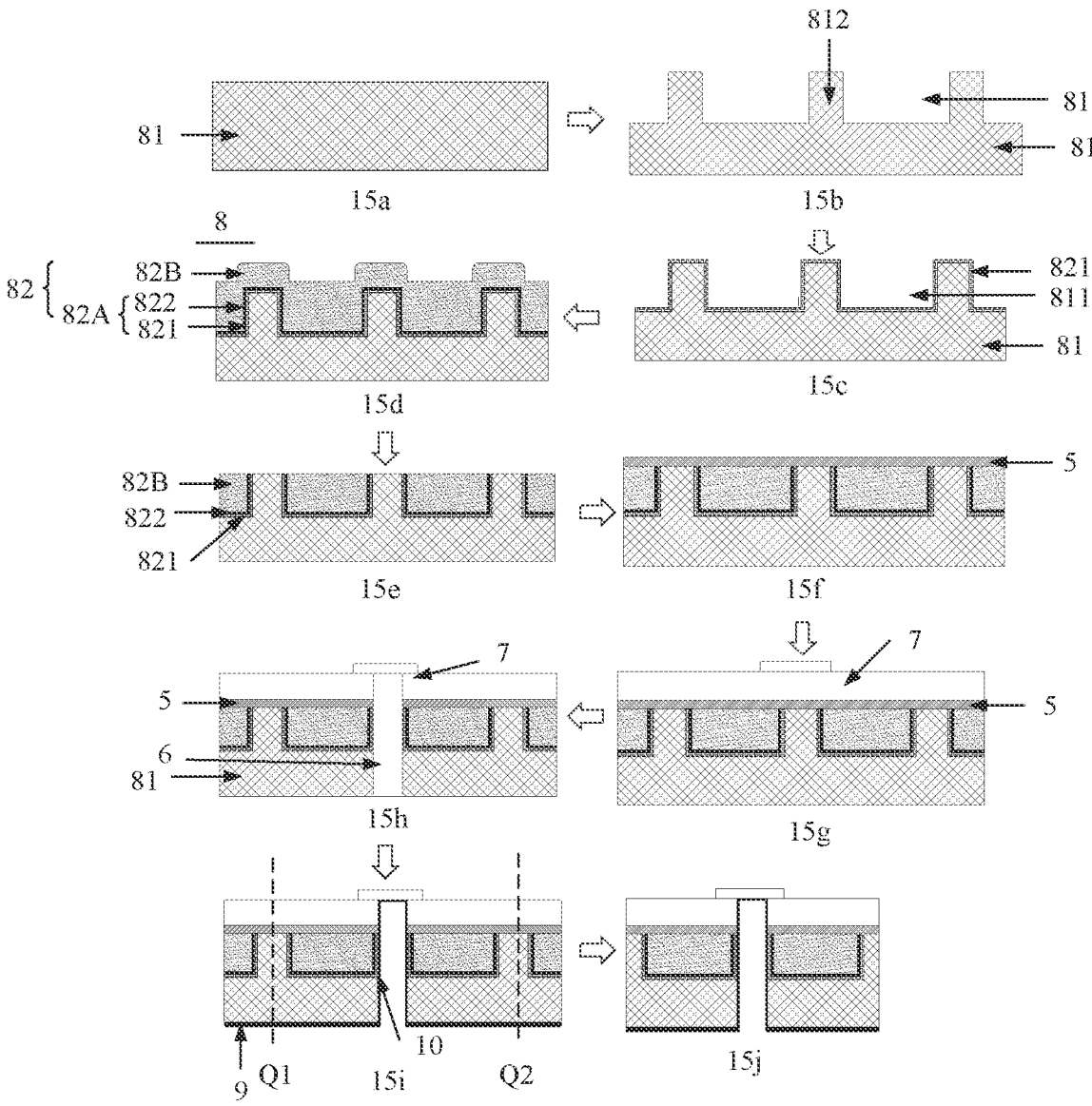
FIG. 15 is a schematic diagram of a corresponding structure obtained after steps of a manufacture method for a semiconductor structure according to an embodiment of this application are completed.

An embodiment of this application further provides a manufacture method for a semiconductor structure. As shown in FIG. 15, the manufacture method for a semiconductor structure includes the following steps.

As shown in 15a and 15b of FIG. 15, a groove 811 is provided on a surface of a base plate 81 to form a boss 812.

There may be one or more bosses 812, and a quantity of bosses 812 needs to be determined based on a quantity of conducting vias.

In addition, if there are a plurality of conducting vias and a distance between every two adjacent conducting vias is small, a boss with a large area may be formed to accommodate all the conducting vias.

As shown in 15c to 15e of FIG. 15, a diamond 82 is disposed in the groove 811 to obtain a substrate 8 including the base plate 81 and the diamond 82.

In an optional implementation, preparation of the diamond includes the following steps.

As shown in 15c of FIG. 15, a nanocrystalline diamond seed layer 821 is prepared on a bottom surface and a side wall surface of the groove 811.

As shown in 15d of FIG. 15, a nanocrystalline diamond nucleation layer 822 is prepared on the nanocrystalline diamond seed layer 821, so that grains grow on the nanocrystalline diamond nucleation layer 822 in the preparation process to form a microcrystalline diamond layer. A diamond layer with a nanometer-level average volume of grains forms a first diamond layer 82A, and a diamond layer with a micrometer-level average volume of grains forms a second diamond layer 82B.

When the nanocrystalline diamond seed layer 821 is prepared, colloidal diamond seed particles may be sprayed to prepare the nanocrystalline diamond seed layer 821, or the base plate 81 may be placed in a nanocrystalline diamond particle solution to perform ultrasonic processing to prepare the nanocrystalline diamond seed layer 821.

When the nanocrystalline diamond nucleation layer 822 is prepared, a chemical vapor deposition method may be used for preparation.

As shown in 15d of FIG. 15, after the diamond is prepared, the diamond covers the boss. As shown in 15e of FIG. 15, the diamond needs to be ground and polished to expose a surface of the boss and make the diamond be flush or approximately flush with the surface of the boss.

As shown in 15f of FIG. 15, a bonding layer 5 is disposed on an upper surface of the substrate.

The bonding layer may be a Si layer, a SiC layer, a SiO₂ layer, a SiN layer, a polycrystalline silicon carbide layer, an amorphous silicon carbide layer, or a polycrystalline silicon carbide layer and an amorphous silicon carbide layer that are stacked.

During formation of the polycrystalline silicon carbide layer and the amorphous silicon carbide layer that are stacked, the polycrystalline silicon carbide layer may be first formed on the upper surface of the substrate, and then surface activation processing is performed on a surface of the polycrystalline silicon carbide layer to form the amorphous silicon carbide layer.

As shown in 15g of FIG. 15, a semiconductor device 7 is disposed on the upper surface of the substrate 8 by using the bonding layer 5.

For example, when the semiconductor device is an HEMT, a position of a source of the HEMT corresponds to a position of the boss.

As shown in 15h and 15i of FIG. 15, a via 6 is provided on the boss, the bonding layer, and at least a part of the semiconductor device, and metallization processing is performed on the via 6 to form a conducting via 10.

As shown in 15i of FIG. 15, a metal layer 9 is disposed on a lower surface of the substrate, and the conducting via 10 is electrically connected to the metal layer 9.

In this embodiment of this application, when metallization processing is performed on the via by using the deposition method, a metal layer is also deposited on the lower surface of the substrate. If the semiconductor device includes a structure that needs to be grounded, no metal layer needs to be prepared by using an additional process means, and the deposited metal layer directly serves as a final metal layer. If the semiconductor device is a chip, the metal layer on the lower surface of the substrate needs to be removed, and then a rewiring layer is prepared and is electrically connected to the conducting via.

In the foregoing manufacture method, the groove is provided on the base plate so that the diamond is disposed in the groove, the boss is intended to reserve a space for the conducting via, and the boss is usually etched by using a plasma etching process to obtain a via. Compared with a manner of etching a diamond to obtain a via in a conventional technology, in this manner, efficiency of a chemical reaction between a plasma gas and the boss (for example, made of a silicon material or a silicon carbide material) is higher, and an etching speed is higher. Therefore, efficiency of providing a hole is significantly improved in this application.

Figure 16:
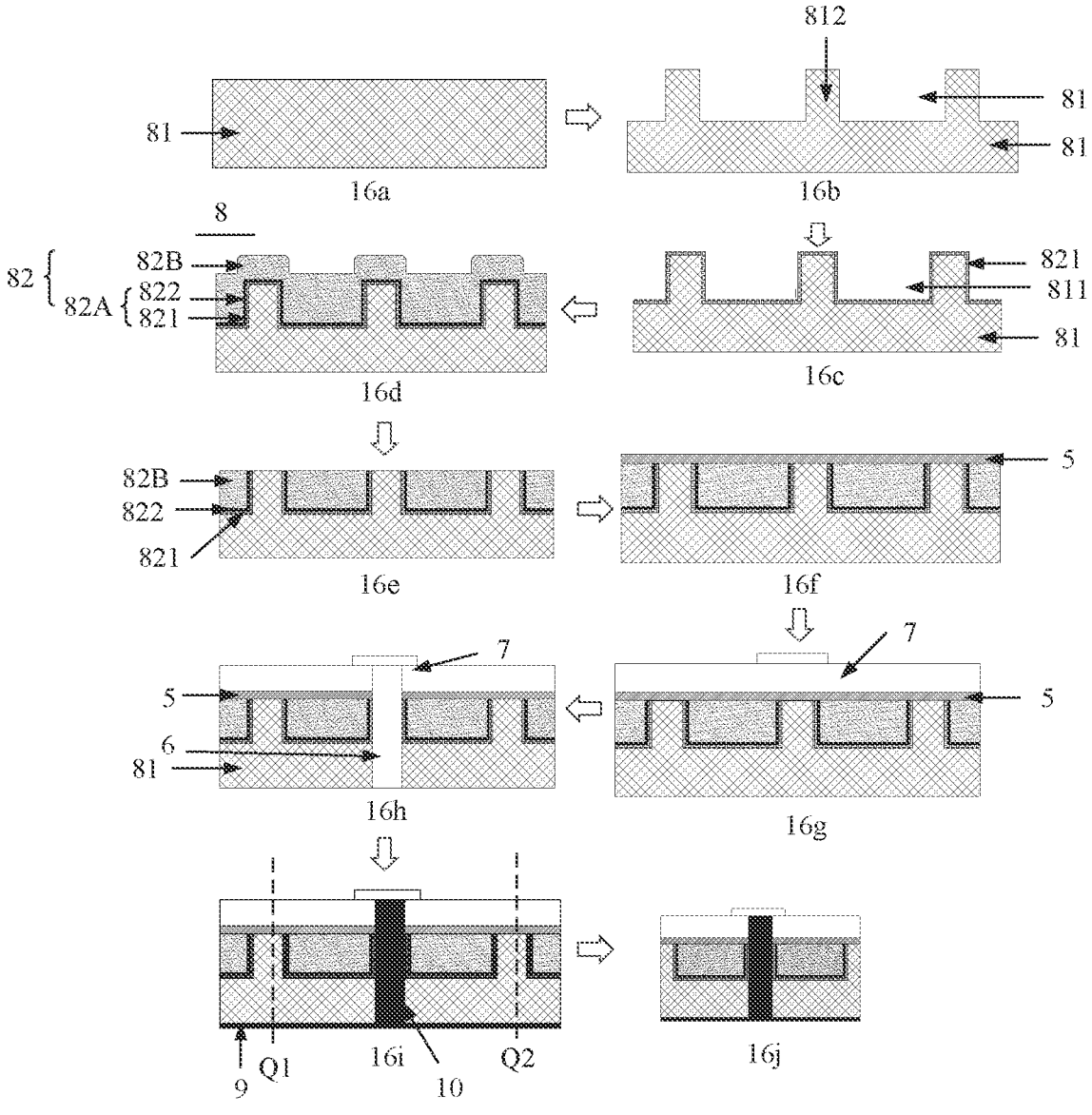
FIG. 16 is a schematic diagram of a corresponding structure obtained after steps of a manufacture method for a semiconductor structure according to an embodiment of this application are completed.

FIG. 16 also shows a manufacture method for a semiconductor structure. A difference between this manufacture method and the manufacture method of FIG. 15 is as follows: As shown in 15h and 15i of FIG. 15, after the via 6 is provided, a conducting layer is prepared on an inner wall surface of the via 6 to form the conducting via 10 in a hollow structure. As shown in 16h and 16i of FIG. 16, after a via 6 is provided, the via 6 is filled with a conducting material to form a conducting via 10 in a solid structure.

In addition, when the semiconductor structure is prepared, instead of preparing only one semiconductor structure at a time, a plurality of semiconductor devices are integrated on one substrate. As shown in 15i of FIGS. 15 and 16i of FIG. 16, a cutting process is performed, where Q1 and Q2 are cutting lines. It can be learned from the figures that, in an implementation of this application, cutting is performed on the base plate, thereby improving cutting efficiency, and finally improving efficiency of preparing a plurality of semiconductor structures.

Figure 17:
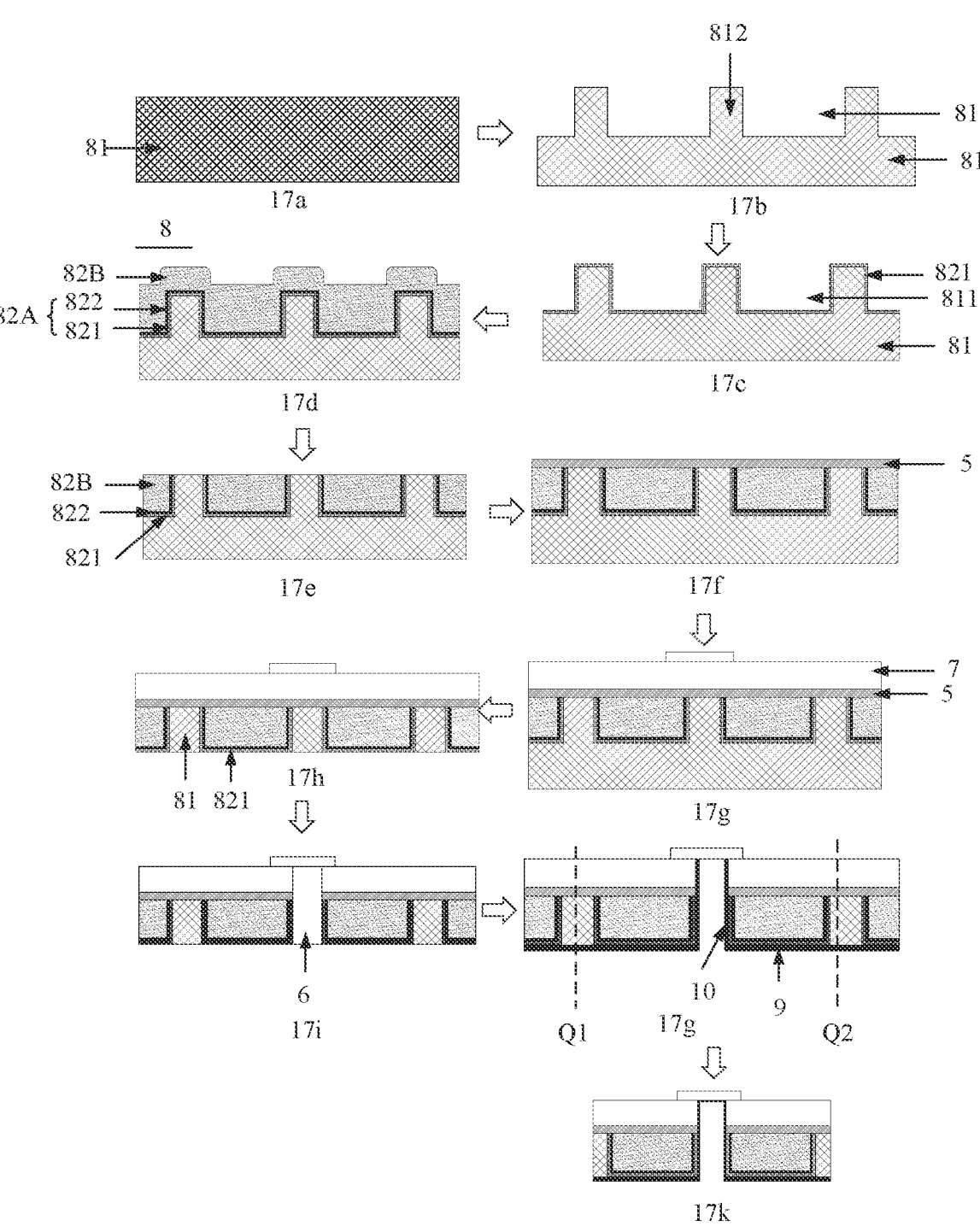
FIG. 17 is a schematic diagram of a corresponding structure obtained after steps of a manufacture method for a semiconductor structure according to an embodiment of this application are completed.

FIG. 17 also shows a manufacture method for a semiconductor structure. A difference between this manufacture method for a semiconductor structure and the manufacture method shown in FIG. 15 is as follows: As shown in 17h of FIG. 17, after a substrate is bonded to a semiconductor device by using a bonding layer, a base plate on a bottom surface of a groove is removed, so that a first diamond layer on the bottom surface of the groove is exposed outside the base plate. A remaining preparation process is the same as that of the manufacture method shown in FIG. 15. Certainly, the base plate on the bottom surface of the groove may alternatively be removed before the substrate is bonded to the semiconductor device. A manner of removing the base plate may be grinding or etching.

Figure 18:
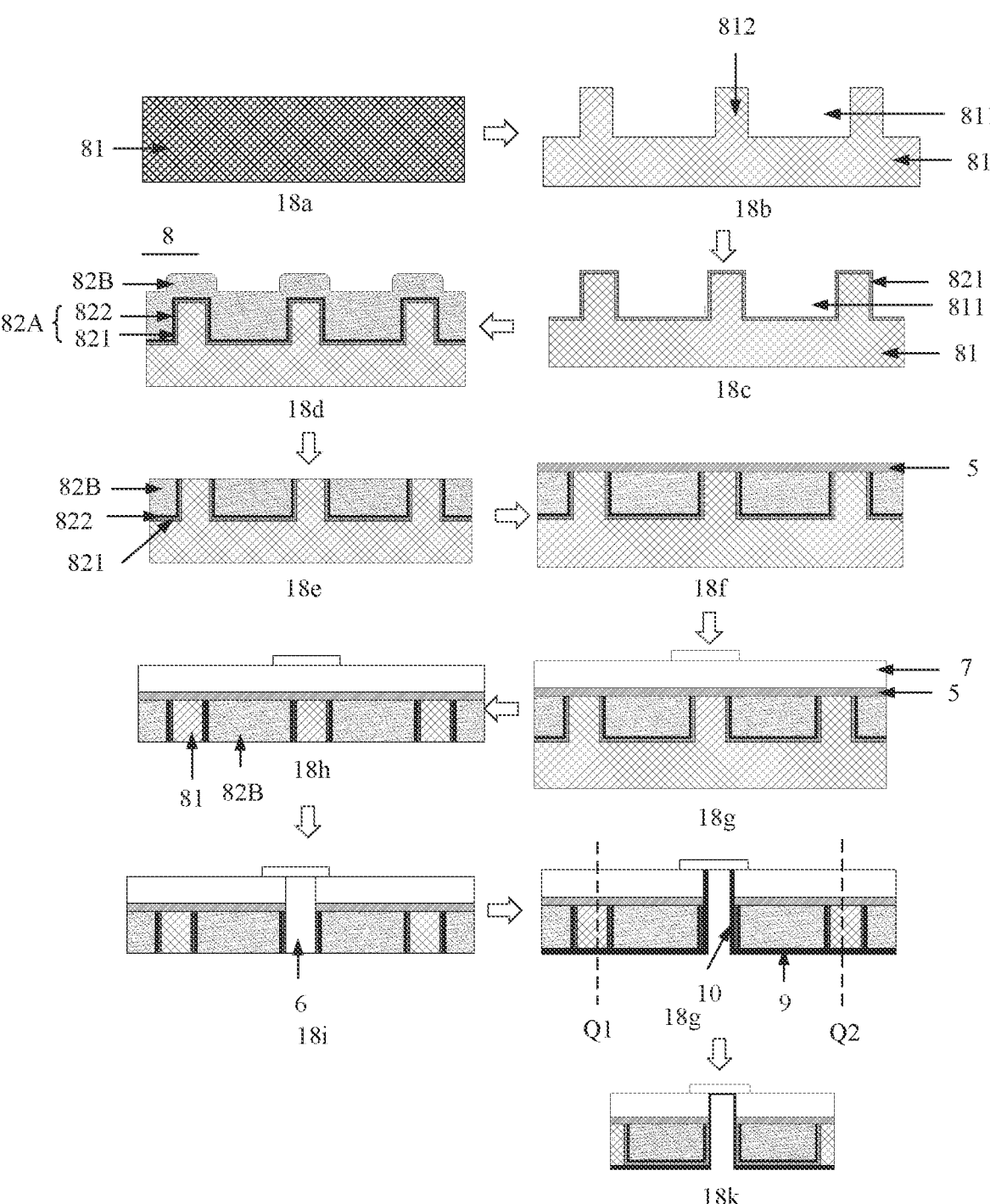
FIG. 18 is a schematic diagram of a corresponding structure obtained after steps of a manufacture method for a semiconductor structure according to an embodiment of this application are completed.

FIG. 18 also shows a manufacture method for a semiconductor structure. A difference from the manufacture method shown in FIG. 17 is as follows: As shown in 18h of FIG. 18, after a substrate is bonded to a semiconductor device by using a bonding layer, a base plate on a bottom surface of a groove is removed, so that a second diamond layer on the bottom surface of the groove is exposed outside the base plate. A remaining preparation process is the same as that of the manufacture method shown in FIG. 17. Certainly, the base plate on the bottom surface of the groove may alternatively be removed before the substrate is bonded to the semiconductor device.

Figure 19:
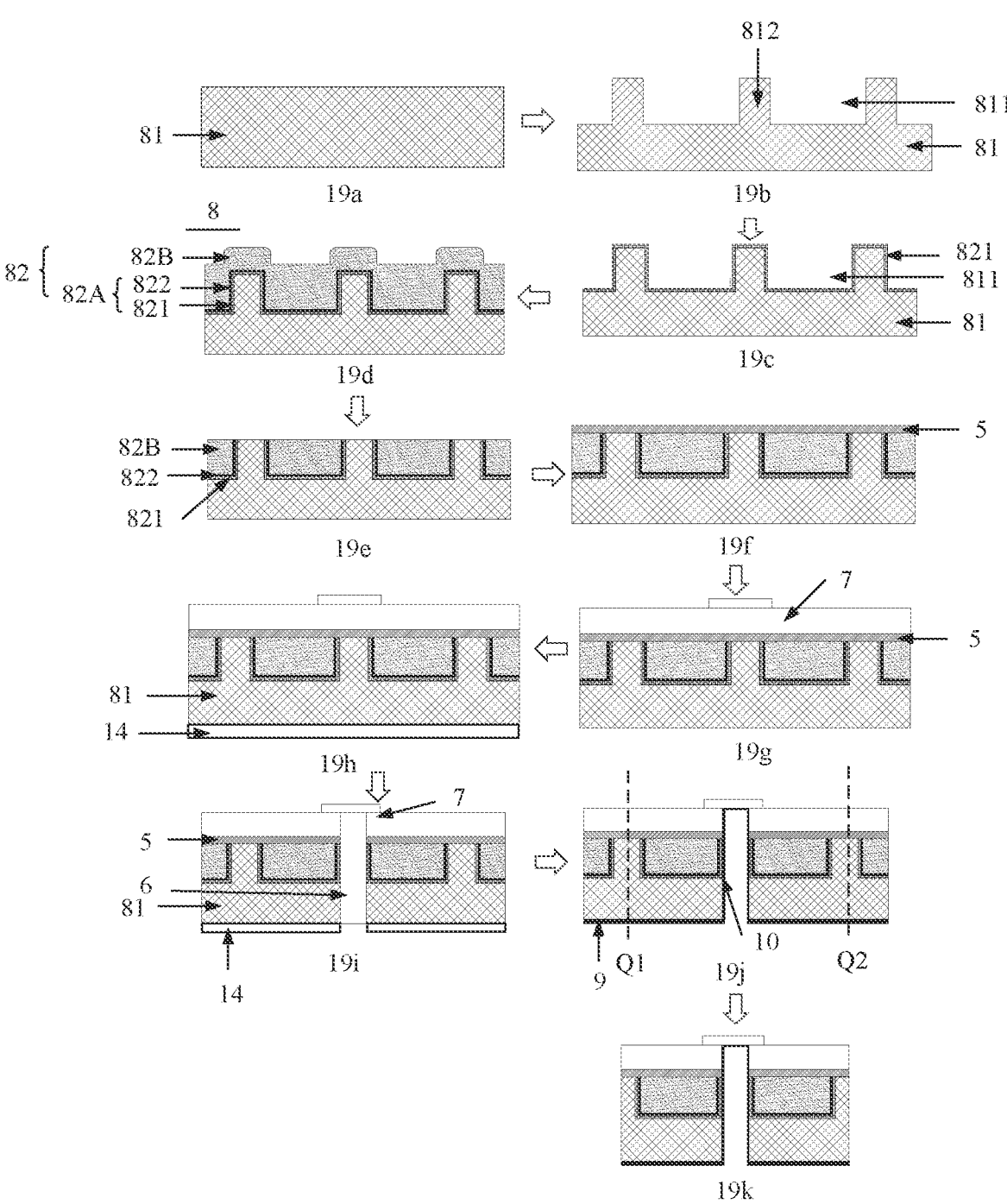
FIG. 19 is a schematic diagram of a corresponding structure obtained after steps of a manufacture method for a semiconductor structure according to an embodiment of this application are completed.

FIG. 19 also shows a manufacture method for a semiconductor structure. A semiconductor structure prepared by using the manufacture method is the same as the semiconductor structure prepared by using the method shown in FIG. 15. A difference between the manufacture method in FIG. 19 and the manufacture method in FIG. 15 is as follows: As shown in 19h and 19i of FIG. 19, before a via is provided, a mask layer 14 is disposed on a lower surface of a base plate 81. The mask layer 14 is disposed to prevent a part, of the base plate, that does not need to be etched from being etched when the via is provided through etching. Before metallization processing is performed on the via, the mask layer on the base plate needs to be removed, and then a subsequent step is performed.

The mask layer may be a metal layer or an insulation layer.

In the manufacture methods shown in FIG. 16 and FIG. 17, no mask layer needs to be disposed before the via is provided, because the base plate on the bottom surface of the groove is removed before the via is provided, and the diamond is exposed. The diamond has quite strong chemical inertness and can hardly be etched. Therefore, no mask layer needs to be disposed.

Figure 20:
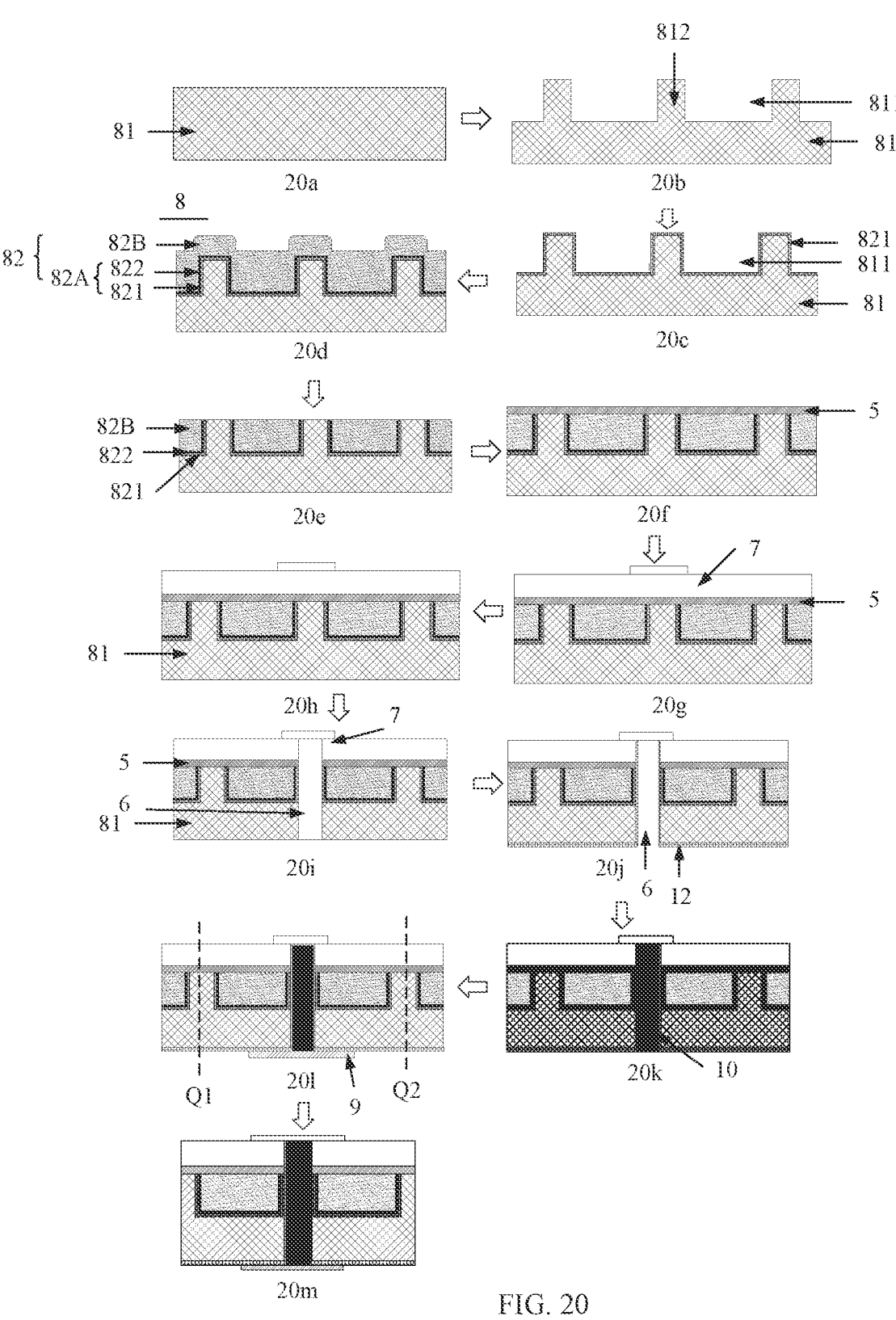
FIG. 20 is a schematic diagram of a corresponding structure obtained after steps of a manufacture method for a semiconductor structure according to an embodiment of this application are completed.

FIG. 20 also shows a manufacture method for a semiconductor structure. In the manufacture method, a semiconductor device is a chip, and a metal layer is a rewiring layer. Therefore, as shown in 20j of FIG. 20, after a via is prepared through processing, an insulation layer 12 is disposed on an inner wall surface of the via, and an insulation layer 12 is disposed on a lower surface of a base plate. In 20k, metallization processing is performed on the via with the insulation layer to prepare a conducting via. In 20l, a rewiring layer is disposed on the insulation layer of the base plate, and is electrically connected to the conducting via.

In the manufacture method shown in FIG. 20, before the via is provided, a mask layer may also be disposed on the lower surface of the base plate. The mask layer is intended to prevent a part, of the base plate, that does not need to be etched from being etched when the via is provided through etching. A difference from FIG. 19 is as follows: The mask layer is an insulation layer, and the mask layer is not removed, so that the mask layer serves as an insulation layer on the lower surface of the base plate.

Figure 21:
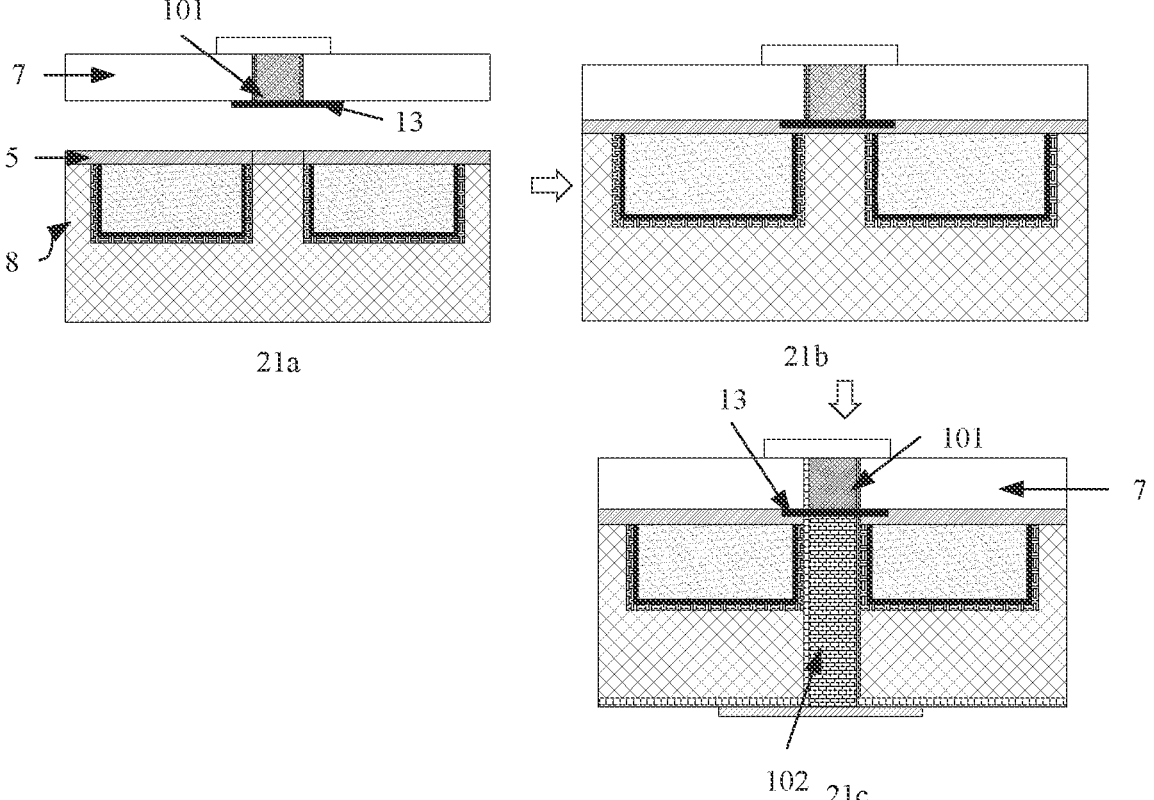
FIG. 21 is a schematic diagram of a corresponding structure obtained after steps of a manufacture method for a semiconductor structure according to an embodiment of this application are completed.

FIG. 21 shows a manufacture method for a semiconductor structure. Before a semiconductor device 7 is bonded to a substrate by using a bonding layer 5, as shown in 21a of FIG. 21, a first section of conducting via 101 is already provided on the semiconductor device 7. In addition, an intermediate metal layer 13 is disposed on a lower surface of the semiconductor device 7, and the intermediate metal layer 13 is electrically connected to the first section of conducting via. In this case, after the semiconductor device provided with the first section of conducting via is bonded to the substrate as shown in 21*b* of FIG. 21, a hole needs to be provided only on the substrate and the bonding layer as shown in 21*c* of FIG. 21. In addition, when the hole is provided, no requirement is specified on whether an axial direction of the second section of conducting via is the same as an axial direction of the first section of conducting via or whether an area of a cross section of the second section of conducting via is the same as an area of a cross section of the first section of conducting via, provided that the second section of conducting via is in contact with the intermediate metal layer. This can reduce difficulty in providing a hole.

In the descriptions of this specification, the described specific features, structures, materials, or characteristics may be combined in a proper manner in any one or more of embodiments or examples.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A semiconductor structure, comprising:
a semiconductor device,
a bonding layer,
a substrate, and
a metal layer, wherein
the semiconductor device is disposed on an upper surface of the substrate by using the bonding layer, and the metal layer is disposed on a lower surface of the substrate;
the substrate comprises a base plate, a groove formed on the base plate, and a diamond accommodated in the groove;
the semiconductor structure further comprises a conducting via, wherein the conducting via penetrates the substrate, the bonding layer, and at least a part of the semiconductor device, and is electrically connected to the metal layer, and wherein the conducting via comprises a first section located on the semiconductor device and a second section located on the substrate and the bonding layer, and the first section and the second section are non-coaxial; and
the groove bypasses the conducting via.

2. The semiconductor structure according to claim 1, wherein the diamond on a bottom surface of the groove is exposed outside the base plate.

3. The semiconductor structure according to claim 1, wherein the diamond comprises:
a first diamond layer and a second diamond layer, wherein
the first diamond layer is formed on a bottom surface of the groove and a side wall surface of the groove, and the second diamond layer is formed on the first diamond layer, and
an average volume of grains of the first diamond layer is smaller than an average volume of grains of the second diamond layer.

4. The semiconductor structure according to claim 3, wherein the first diamond layer on the bottom surface of the groove is exposed outside the base plate.

5. The semiconductor structure according to claim 3, wherein the second diamond layer on the bottom surface of the groove is exposed outside the base plate.

6. The semiconductor structure according to claim 1, wherein a boss is formed on the base plate, and a plurality of conducting vias are provided on the boss.

7. The semiconductor structure according to claim 1, wherein the semiconductor device is an active device comprising a grounding structure, the metal layer is a grounding layer, and the conducting via is electrically connected to the grounding structure.

8. The semiconductor structure according to claim 1, wherein the semiconductor device is a chip, the chip comprises an active layer and a passive layer that are stacked, a first rewiring layer is arranged on the active layer, the metal layer is a second rewiring layer, the conducting via is electrically connected to the first rewiring layer,
the semiconductor structure further comprises:
a first insulation layer between the second rewiring layer and the substrate, and
a second insulation layer between the conducting via and the chip, the bonding layer, and the substrate.

9. The semiconductor structure according to claim 1, wherein the semiconductor structure further comprises: an intermediate metal layer on a surface of the semiconductor device, the surface of the semiconductor device is opposite to the bonding layer, and the conducting via is electrically connected to the intermediate metal layer.

10. The semiconductor structure according to claim 9, wherein a at least one of an area of a cross section of the first section of the conducting via and an area of a cross section of the second section of the conducting via is smaller than a surface area of the intermediate metal layer.

11. The semiconductor structure according to claim 1, wherein the bonding layer comprises a polycrystalline silicon carbide layer, an amorphous silicon carbide layer, or a polycrystalline silicon carbide layer and an amorphous silicon carbide layer that are stacked.

12. A manufacture method for a semiconductor structure, comprising:
providing a groove on a surface of a base plate to form a boss;
disposing a diamond in the groove to obtain a substrate comprising the base plate and the diamond;
removing the base plate on a bottom surface of the groove to expose the diamond on the bottom surface of the groove outside the base plate;
disposing a semiconductor device on an upper surface of the substrate by using a bonding layer;
providing a via on the boss, the bonding layer, and at least a part of the semiconductor device, and performing metallization processing on the via to form a conducting via; and
disposing a metal layer on a lower surface of the substrate to electrically connect the conducting via to the metal layer.

13. The manufacture method for a semiconductor structure according to claim 12, wherein the disposing the diamond in the groove comprises:
preparing a nanocrystalline diamond seed layer on a bottom surface of the groove and a side wall surface of the groove; and
preparing a nanocrystalline diamond nucleation layer on the nanocrystalline diamond seed layer to have nanograins grow to form a microcrystalline diamond layer, wherein a first layer with a nanometer-level average volume of diamond grains forms a first diamond layer, and a second layer with a micrometer-level average volume of diamond grains forms a second diamond layer.

14. The manufacture method for a semiconductor structure according to claim 13, wherein after the disposing the diamond in the groove, the method further comprises:

removing the base plate on the bottom surface of the groove to expose the first diamond layer on the bottom surface of the groove outside the base plate; or removing the base plate on the bottom surface of the groove to expose the second diamond layer on the bottom surface of the groove outside the base plate.

15. The manufacture method for a semiconductor structure according to claim 12, wherein after the providing the via on the boss, the bonding layer, and the at least the part of the semiconductor device, the method further comprises:

disposing an insulation layer on an inner wall surface of the via, disposing an insulation layer on the lower surface of the substrate, and then performing metallization processing on the via with the insulation layer.

16. The semiconductor structure according to claim 10, wherein an axial direction of the first section of the conducting via and an axial direction of the second section of the conducting via are not on one straight line.

* * * * *